US006424158B2

(12) United States Patent
Klang

(10) Patent No.: US 6,424,158 B2
(45) Date of Patent: Jul. 23, 2002

(54) APPARATUS AND METHOD FOR CARRYING OUT DIAGNOSTIC TESTS ON BATTERIES AND FOR RAPIDLY CHARGING BATTERIES

(75) Inventor: James K. Klang, Eagan, MN (US)

(73) Assignee: Midtronics, Inc., Willowbrook, IL (US)

( * ) Notice: Subject to any disclaimer, the term of this patent is extended or adjusted under 35 U.S.C. 154(b) by 0 days.

(21) Appl. No.: 09/902,492

(22) Filed: Jul. 10, 2001

Related U.S. Application Data

(62) Division of application No. 09/361,487, filed on Jul. 26, 1999, now Pat. No. 6,259,254.
(60) Provisional application No. 60/094,308, filed on Jul. 27, 1998.

(51) Int. Cl.[7] ............... H01M 10/44; H01M 10/46; G01N 27/416

(52) U.S. Cl. ............... 324/433; 320/165; 320/156

(58) Field of Search ............... 320/124, 125, 320/132, 134, 136, 148, 152, 151, 157, 156, 159, 160, 161, 162, 163, 165; 324/426, 433, 434

(56) References Cited

U.S. PATENT DOCUMENTS

| | | | |
|---|---|---|---|
| 2,514,745 A | 7/1950 | Dalzell | 171/95 |
| 3,356,936 A | 12/1967 | Smith | 324/29.5 |
| 3,562,634 A | 2/1971 | Latner | 31/4 |
| 3,593,099 A | 7/1971 | Scholl | 320/13 |
| 3,607,673 A | 9/1971 | Seyl | 204/1 |
| 3,676,770 A | 7/1972 | Sharaf et al. | 324/29.5 |
| 3,729,989 A | 5/1973 | Little | 73/133 |
| 3,753,094 A | 8/1973 | Furuishi et al. | 324/29.5 |
| 3,808,522 A | 4/1974 | Sharaf | 324/29.5 |
| 3,811,089 A | 5/1974 | Strezelewicz | 324/170 |
| 3,873,911 A | 3/1975 | Champlin | 324/29.5 |
| 3,876,931 A | 4/1975 | Godshalk | 324/29.5 |
| 3,886,443 A | 5/1975 | Miyakawa et al. | 324/29.5 |
| 3,889,248 A | 6/1975 | Ritter | 340/249 |
| 3,906,329 A | 9/1975 | Bader | 320/44 |
| 3,909,708 A | 9/1975 | Champlin | 324/29.5 |
| 3,936,744 A | 2/1976 | Perlmutter | 324/158 |
| 3,946,299 A | 3/1976 | Christianson et al. | 320/43 |
| 3,947,757 A | 3/1976 | Grube et al. | 324/28 |
| 3,969,667 A | 7/1976 | McWilliams | 324/29.5 |
| 3,979,664 A | 9/1976 | Harris | 324/17 |
| 3,984,762 A | 10/1976 | Dowgiallo, Jr. | 324/29.5 |
| 3,984,768 A | 10/1976 | Staples | 324/62 |
| 3,989,544 A | 11/1976 | Santo | 429/65 |
| 4,008,619 A | 2/1977 | Alcaide et al. | 73/398 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/29.5 |
| 4,070,624 A | 1/1978 | Taylor | 327/158 |
| 4,086,531 A | 4/1978 | Bernier | 324/158 |
| 4,112,351 A | 9/1978 | Back et al. | 324/16 |

(List continued on next page.)

FOREIGN PATENT DOCUMENTS

| | | |
|---|---|---|
| DE | 29 26 716 B1 | 1/1981 |
| EP | 0 022 450 A1 | 1/1981 |
| EP | 0 637 754 A1 | 2/1995 |
| EP | 0 772 056 A1 | 5/1997 |
| FR | 2 749 397 | 12/1997 |
| GB | 2 088 159 A | 6/1982 |
| JP | 59-17892 | 1/1984 |
| JP | 59-17893 | 1/1984 |
| JP | 59-17894 | 1/1984 |
| JP | 59017894 | 1/1984 |

(List continued on next page.)

OTHER PUBLICATIONS

"Electrochemical Impedance Spectroscopy in Battery Development and Testing", *Batteries International*, Apr. 1997, pp. 59 and 62–63.
"Battery Impedance", by E. Willihnganz et al., *Electrical Engineering*, Sep. 1959, pp. 922–925.
"Determining The End of Battery Life", by S. DeBardelaben, *IEEE*, 1986, pp. 365–368.
"A Look at the Impedance of a Cell", by S. Debardelaben, *IEEE*, 1988, pp. 394–397.
"The Impedance of Electrical Storage Cells", by N.A. Hampson et al., *Journal of Applied Electrochemistry*, 1980, pp. 3–11.
"A Package for Impedance/Admittance Data Analysis", by B. Boukamp, *Solid State Ionics*, 1986, pp. 136–140.
"Precision of Impedance Spectroscopy Estimates of Bulk, Reaction Rate, and Diffusion Parameters", by J. Macdonald et al., *J. Electroanal, Chem.*, 1991, pp. 1–11.

(List continued on next page.)

*Primary Examiner*—Edward H. Tso
(74) *Attorney, Agent, or Firm*—Westman, Champlin & Kelly, P.A.

(57) ABSTRACT

A method and system for performing automatic and rapid diagnostic testing and charging of a battery. The diagnostic test unit utilizes a charger combined with a rapidly variable load. After inputting battery characteristics including the cranking rating (CCA or CA) and the temperature of the battery, a diagnostic ramp procedure is utilized to provide an instantaneous current versus voltage analysis to determine the instantaneous cranking value (i.e., the single crank capability at full charge) of the battery being tested. If the instantaneous cranking value of the battery is above a level determined acceptable, a sustained discharge is carried out to tax the capacity of the battery.

At the end of the constant current discharge, the current is again to determine a loaded cranking value which simulates the battery power after multiple cranking attempts. If the loaded cranking value is below a desired percentage of the cranking rating, then the battery is put into charge. If a battery cannot be acceptably charged within the time of a given number of diagnostic probes, the battery is deemed to be a bad battery. The charging steps utilized during the diagnostic testing, as well as any charging of batteries determined to be good, utilizes a novel interactive stepping procedure which allows batteries determined to be good to be recharged in a minimum period of time without overheating the battery.

40 Claims, 27 Drawing Sheets

U.S. PATENT DOCUMENTS

| | | |
|---|---|---|
| 4,114,083 A | 9/1978 | Benham et al. .............. 320/39 |
| 4,126,874 A | 11/1978 | Suzuki et al. ................ 354/60 |
| 4,178,546 A | 12/1979 | Hulls et al. ................ 324/158 |
| 4,193,025 A * | 3/1980 | Frailing et al. |
| 4,207,611 A | 6/1980 | Gordon ...................... 364/580 |
| 4,217,645 A | 8/1980 | Barry et al. ................ 364/483 |
| 4,297,639 A | 10/1981 | Branham .................... 324/429 |
| 4,315,204 A | 2/1982 | Sievers et al. ................ 322/28 |
| 4,316,185 A | 2/1982 | Watrous et al. ............ 340/636 |
| 4,322,685 A | 3/1982 | Frailing et al. ............. 324/429 |
| 4,351,405 A | 9/1982 | Fields et al. .................. 180/65 |
| 4,363,407 A | 12/1982 | Barkler et al. ............... 209/3.3 |
| 4,369,407 A | 1/1983 | Korbell ...................... 324/416 |
| 4,379,989 A | 4/1983 | Kurz et al. |
| 4,379,990 A | 4/1983 | Sievers et al. ................ 322/99 |
| 4,390,828 A | 6/1983 | Converse et al. ............. 320/32 |
| 4,392,101 A | 7/1983 | Saar et al. .................... 320/20 |
| 4,396,880 A | 8/1983 | Windebank ................. 320/21 |
| 4,408,157 A | 10/1983 | Beaubien .................... 324/62 |
| 4,412,169 A | 10/1983 | Dell'Orto ................... 320/64 |
| 4,423,378 A | 12/1983 | Marino et al. ............. 324/427 |
| 4,423,379 A | 12/1983 | Jacobs et al. .............. 324/429 |
| 4,424,491 A | 1/1984 | Bobbett et al. ............. 324/433 |
| 4,459,548 A | 7/1984 | Lentz et al. ................ 324/158 |
| 4,514,694 A | 4/1985 | Finger ........................ 324/429 |
| 4,520,353 A | 5/1985 | McAuliffe .................. 340/636 |
| 4,633,418 A | 12/1986 | Bishop ....................... 364/554 |
| 4,659,977 A | 4/1987 | Kissel et al. ................. 320/64 |
| 4,663,580 A | 5/1987 | Wortman ..................... 320/35 |
| 4,667,143 A | 5/1987 | Cooper et al. ................ 320/22 |
| 4,667,279 A | 5/1987 | Maier .......................... 363/46 |
| 4,678,998 A | 7/1987 | Muramatsu ................. 324/427 |
| 4,679,000 A | 7/1987 | Clark ......................... 324/428 |
| 4,680,528 A | 7/1987 | Mikami et al. |
| 4,697,134 A | 9/1987 | Burkum et al. ............. 320/48 |
| 4,707,795 A | 11/1987 | Alber et al. ................ 364/550 |
| 4,709,202 A | 11/1987 | Koenck et al. .............. 320/43 |
| 4,710,861 A | 12/1987 | Kanner ....................... 363/46 |
| 4,719,428 A | 1/1988 | Liebermann ............... 324/436 |
| 4,743,855 A | 5/1988 | Randin et al. .............. 324/430 |
| 4,745,349 A | 5/1988 | Palanisamy et al. .......... 320/22 |
| 4,816,768 A | 3/1989 | Champlin ................... 324/428 |
| 4,820,966 A | 4/1989 | Fridman ..................... 320/32 |
| 4,825,170 A | 4/1989 | Champlin ................... 324/436 |
| 4,847,547 A | 7/1989 | Eng, Jr. ...................... 320/35 |
| 4,849,700 A | 7/1989 | Morioka et al. ............ 324/427 |
| 4,876,495 A | 10/1989 | Palanisamy et al. .......... 320/18 |
| 4,881,038 A | 11/1989 | Champlin ................... 324/426 |
| 4,912,416 A | 3/1990 | Champlin ................... 324/430 |
| 4,913,116 A | 4/1990 | Katogi et al. ............... 123/425 |
| 4,929,931 A | 5/1990 | McCuen ..................... 340/636 |
| 4,931,738 A | 6/1990 | MacIntyre et al. .......... 324/435 |
| 4,937,528 A | 6/1990 | Palanisamy ................ 324/430 |
| 4,947,124 A | 8/1990 | Hauser ....................... 324/430 |
| 4,956,597 A | 9/1990 | Heavey et al. ................ 320/14 |
| 4,968,941 A | 11/1990 | Rogers ........................ 324/428 |
| 4,968,942 A | 11/1990 | Palanisamy ................ 324/430 |
| 5,004,979 A | 4/1991 | Marino et al. .............. 324/160 |
| 5,032,825 A | 7/1991 | Xuznicki .................... 340/636 |
| 5,047,722 A | 9/1991 | Wurst et al. ................ 324/430 |
| 5,087,881 A | 2/1992 | Peacock ...................... 324/378 |
| 5,095,223 A | 3/1992 | Thomas ...................... 307/110 |
| 5,126,675 A | 6/1992 | Yang .......................... 324/435 |
| 5,140,269 A | 8/1992 | Champlin ................... 324/433 |
| 5,144,218 A | 9/1992 | Bosscha ...................... 320/44 |
| 5,144,248 A | 9/1992 | Alexandres et al. ........ 324/428 |
| 5,160,881 A | 11/1992 | Schramm et al. ............. 322/7 |
| 5,170,124 A | 12/1992 | Blair et al. .................. 324/434 |
| 5,179,335 A | 1/1993 | Nor ............................ 320/21 |
| 5,194,799 A | 3/1993 | Tomantschger ............. 320/2 |
| 5,204,611 A | 4/1993 | Nor et al. .................... 320/21 |
| 5,214,370 A | 5/1993 | Harm et al. .................. 320/35 |
| 5,214,385 A | 5/1993 | Gabriel et al. .............. 324/434 |
| 5,241,275 A | 8/1993 | Fang .......................... 324/430 |
| 5,254,952 A | 10/1993 | Salley et al. ................ 324/429 |
| 5,266,880 A | 11/1993 | Newland .................... 320/14 |
| 5,281,919 A | 1/1994 | Palanisamy ................ 324/427 |
| 5,281,920 A | 1/1994 | Wurst ........................ 324/430 |
| 5,295,078 A | 3/1994 | Stich et al. .................. 364/483 |
| 5,298,797 A | 3/1994 | Redl .......................... 307/246 |
| 5,300,874 A | 4/1994 | Shimamoto et al. .......... 320/15 |
| 5,302,902 A | 4/1994 | Groehl ........................ 324/434 |
| 5,315,287 A | 5/1994 | Sol ............................. 340/455 |
| 5,321,626 A | 6/1994 | Palladino .................... 364/483 |
| 5,331,268 A | 7/1994 | Patino et al. ................. 320/20 |
| 5,336,993 A | 8/1994 | Thomas et al. ........... 324/158.1 |
| 5,338,515 A | 8/1994 | Dalla Betta et al. .......... 422/95 |
| 5,339,018 A | 8/1994 | Brokaw ...................... 320/35 |
| 5,343,380 A | 8/1994 | Champlin .................... 363/46 |
| 5,345,163 A * | 9/1994 | Gibbons et al. |
| 5,347,163 A | 9/1994 | Yoshimura .................. 307/66 |
| 5,352,968 A | 10/1994 | Reni et al. .................... 320/35 |
| 5,365,160 A | 11/1994 | Leppo et al. ................. 320/22 |
| 5,365,453 A | 11/1994 | Startup et al. .............. 364/481 |
| 5,381,096 A | 1/1995 | Hirzel ........................ 324/427 |
| 5,412,323 A | 5/1995 | Kato et al. .................. 324/429 |
| 5,426,371 A | 6/1995 | Sailey et al. ................ 324/429 |
| 5,426,416 A | 6/1995 | Jefferies et al. ............. 340/664 |
| 5,432,426 A | 7/1995 | Yoshida ...................... 320/20 |
| 5,434,495 A | 7/1995 | Toko .......................... 320/44 |
| 5,435,185 A | 7/1995 | Eagan ......................... 73/587 |
| 5,442,274 A | 8/1995 | Tamai ........................ 320/23 |
| 5,449,996 A | 9/1995 | Matsumoto et al. .......... 320/20 |
| 5,449,997 A | 9/1995 | Gilmore et al. ............. 320/39 |
| 5,451,881 A | 9/1995 | Finger ....................... 324/433 |
| 5,455,026 A | 10/1995 | Eagan ......................... 73/591 |
| 5,457,377 A | 10/1995 | Jonsson ........................ 320/5 |
| 5,469,043 A | 11/1995 | Cherng et al. ............... 320/31 |
| 5,485,090 A | 1/1996 | Stephens .................... 324/433 |
| 5,488,300 A | 1/1996 | Jamieson ................... 324/432 |
| 5,519,383 A | 5/1996 | De La Rosa ............... 340/636 |
| 5,528,148 A | 6/1996 | Rogers ....................... 324/426 |
| 5,537,967 A | 7/1996 | Tashiro et al. ............ 123/792.1 |
| 5,546,317 A | 8/1996 | Andrieu ..................... 364/481 |
| 5,548,273 A | 8/1996 | Nicol et al. ................. 340/439 |
| 5,550,485 A | 8/1996 | Falk ........................... 324/772 |
| 5,561,380 A | 10/1996 | Sway-Tin et al. ........... 324/509 |
| 5,562,501 A | 10/1996 | Kinoshita et al. ........... 439/852 |
| 5,572,136 A | 11/1996 | Champlin ................... 324/426 |
| 5,574,355 A | 11/1996 | McShane et al. ............. 320/39 |
| 5,583,416 A | 12/1996 | Klang ........................ 320/22 |
| 5,585,728 A | 12/1996 | Champlin ................... 324/427 |
| 5,589,757 A | 12/1996 | Klang ........................ 320/22 |
| 5,592,093 A | 1/1997 | Klingbiel .................... 324/426 |
| 5,596,260 A | 1/1997 | Moravec et al. ............. 320/30 |
| 5,598,098 A | 1/1997 | Champlin ................... 324/430 |
| 5,602,462 A | 2/1997 | Stich et al. ................. 323/258 |
| 5,606,242 A | 2/1997 | Hull et al. ................... 320/48 |
| 5,621,298 A | 4/1997 | Harvey ......................... 320/5 |
| 5,633,985 A | 5/1997 | Severson et al. |
| 5,637,978 A | 6/1997 | Kellett et al. .................. 320/2 |
| 5,642,031 A | 6/1997 | Brotto ......................... 320/21 |
| 5,650,937 A | 7/1997 | Bounaga .................... 364/483 |
| 5,652,501 A | 7/1997 | McClure et al. .............. 320/17 |
| 5,653,659 A | 8/1997 | Kunibe et al. .............. 477/111 |
| 5,656,920 A | 8/1997 | Cherng et al. ............... 320/31 |
| 5,675,234 A | 10/1997 | Greene ........................ 320/15 |
| 5,677,077 A | 10/1997 | Faulk .......................... 429/90 |
| 5,699,050 A | 12/1997 | Kanazawa .................. 340/636 |
| 5,701,089 A | 12/1997 | Perkins ...................... 327/772 |
| 5,705,929 A | 1/1998 | Caravello et al. ........... 324/430 |

| | | | | | | |
|---|---|---|---|---|---|---|
| 5,710,503 A | 1/1998 | Sideris et al. ............... 320/6 | JP | 62-180284 | 8/1987 | |
| 5,717,336 A | 2/1998 | Basell et al. ............ 324/430 | JP | 63027776 | 2/1988 | |
| 5,717,937 A | 2/1998 | Fritz ................. 395/750.01 | JP | 03274479 | 12/1991 | |
| 5,739,667 A | 4/1998 | Matsuda et al. | JP | 03282276 | 12/1991 | |
| 5,747,909 A | 5/1998 | Syverson et al. ........ 310/156 | JP | 4-8636 | 1/1992 | |
| 5,754,417 A | 5/1998 | Nicollini .................. 363/60 | JP | 04131779 | 5/1992 | |
| 5,757,192 A | 5/1998 | McShane et al. ........ 324/427 | JP | 04372536 | 12/1992 | |
| 5,760,587 A | 6/1998 | Harvey .................... 324/434 | JP | 5216550 | 8/1993 | |
| 5,773,978 A | 6/1998 | Becker .................... 324/430 | JP | 7-128414 | 5/1995 | |
| 5,789,899 A | 8/1998 | van Phuoc et al. ......... 320/30 | WO | WO 93/22666 | 11/1993 | |
| 5,793,359 A | 8/1998 | Ushikubo ................ 345/169 | WO | WO 94/05069 | 3/1994 | |
| 5,808,469 A | 9/1998 | Kopera ................... 324/43.4 | WO | WO 98/58270 | 12/1998 | |
| 5,818,234 A | 10/1998 | McKinnon ............... 324/433 | WO | WO 99/23738 | 5/1999 | |
| 5,821,756 A | 10/1998 | McShane et al. ........ 324/430 | | | | |
| 5,825,174 A | 10/1998 | Parker .................... 324/106 | | | | |
| 5,831,435 A | 11/1998 | Troy ....................... 324/426 | | | | |
| 5,862,515 A | 1/1999 | Kobayashi et al. ......... 702/63 | | | | |
| 5,872,443 A | 2/1999 | Williamson .............. 320/21 | | | | |
| 5,895,440 A | 4/1999 | Proctor et al. ............. 702/63 | | | | |
| 5,914,605 A | 6/1999 | Bertness .................. 324/430 | | | | |
| 5,929,609 A | 7/1999 | Joy et al. .................... 322/25 | | | | |
| 5,939,855 A | 8/1999 | Proctor et al. ............ 320/104 | | | | |
| 5,939,861 A | 8/1999 | Joko et al. | | | | |
| 5,945,829 A | 8/1999 | Bertness .................. 324/430 | | | | |
| 5,969,625 A | 10/1999 | Russo ..................... 340/636 | | | | |
| 6,002,238 A | 12/1999 | Champlin ............... 320/134 | | | | |
| 6,008,652 A | 12/1999 | Theofanopoulos et al. . 324/434 | | | | |
| 6,009,369 A | 12/1999 | Boisvert et al. ............. 701/99 | | | | |
| 6,031,354 A | 2/2000 | Wiley et al. ............... 320/116 | | | | |
| 6,037,751 A | 3/2000 | Klang ..................... 320/160 | | | | |
| 6,037,777 A | 3/2000 | Champlin ............... 324/430 | | | | |
| 6,051,976 A | 4/2000 | Bertness .................. 324/426 | | | | |
| 6,072,299 A | 6/2000 | Kurie et al. ............... 320/112 | | | | |
| 6,072,300 A | 6/2000 | Tsuji ....................... 320/116 | | | | |
| 6,081,098 A | 6/2000 | Bertness et al. .......... 320/134 | | | | |
| 6,091,245 A | 7/2000 | Bertness .................. 324/426 | | | | |
| 6,094,033 A | 7/2000 | Ding et al. ................. 320/132 | | | | |
| 6,104,167 A | 8/2000 | Bertness et al. .......... 320/132 | | | | |
| 6,114,834 A | 9/2000 | Parise ..................... 320/109 | | | | |
| 6,137,269 A | 10/2000 | Champlin ............... 320/150 | | | | |
| 6,140,797 A | 10/2000 | Dunn ..................... 320/105 | | | | |
| 6,150,793 A | 11/2000 | Lesesky et al. ........... 320/104 | | | | |
| 6,161,640 A | 12/2000 | Yamaguchi .............. 180/65.5 | | | | |
| 6,163,156 A | 12/2000 | Bertness .................. 324/426 | | | | |
| 6,172,483 B1 | 1/2001 | Champlin ............... 320/134 | | | | |
| 6,172,505 B1 | 1/2001 | Bertness .................. 324/430 | | | | |
| 6,181,545 B1 | 1/2001 | Amatucci et al. ......... 361/502 | | | | |
| 6,222,369 B1 | 4/2001 | Champlin ............... 324/430 | | | | |
| 6,225,808 B1 | 5/2001 | Varghese et al. .......... 324/426 | | | | |
| 6,249,124 B1 | 6/2001 | Bertness .................. 324/426 | | | | |
| 6,250,973 B1 | 6/2001 | Lowery et al. ........... 439/763 | | | | |
| 6,254,438 B1 | 7/2001 | Gaunt ..................... 439/755 | | | | |
| 6,259,254 B1 | 7/2001 | Klang .................... 324/427 | | | | |
| 6,262,563 B1 | 7/2001 | Champlin ............... 320/134 | | | | |
| 6,294,896 B1 | 9/2001 | Champlin ............... 320/134 | | | | |
| 6,294,897 B1 | 9/2001 | Champlin ............... 320/153 | | | | |
| 6,304,087 B1 | 10/2001 | Bertness | | | | |
| 6,310,481 B2 | 10/2001 | Bertness | | | | |
| 6,313,607 B1 | 11/2001 | Champlin | | | | |
| 6,313,608 B1 | 11/2001 | Varghese et al. | | | | |
| 6,316,914 B1 | 11/2001 | Bertness | | | | |
| 6,323,650 B1 | 11/2001 | Bertness et al. ........... 324/426 | | | | |
| 6,329,793 B1 | 12/2001 | Bertness et al. ........... 320/132 | | | | |
| 6,331,762 B1 | 12/2001 | Bertness ................... 320/134 | | | | |
| 6,332,113 B1 | 12/2001 | Bertness ..................... 702/63 | | | | |
| 6,346,795 B2 | 2/2002 | Haraguchi et al. ........ 320/136 | | | | |
| 6,347,958 B1 | 2/2002 | Tsai ......................... 439/488 | | | | |

FOREIGN PATENT DOCUMENTS

| | | |
|---|---|---|
| JP | 59215674 | 12/1984 |
| JP | 60225078 | 11/1985 |

OTHER PUBLICATIONS

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131.

IEEE Recommended Practice For Maintenance, Testings, and Replacement of Large Lead Storage Batteries for Generating Stations and Substations, *The Institute of Electrical and Electronics Engineers, Inc., ANSI/IEEE Std.* 450–1987, Mar. 9, 1987, pp. 7–15.

"Field and Laboratory Studies to Assess the State of Health of Valve–Regulated Lead Acid Batteries: Part I Conductance/Capacity Correlation Studies", by D. Feder et al., *IEEE*, Aug. 1992, pp. 218–233.

"Battery Impedance", by E. Willihnganz et al., *Electrical Engineering*, Sep. 1959, pp. 922–925.

"JIS Japanese Industrial Standard–Lead Acid Batteries for Automobiles", *Japanese Standards Association UDC*, 621.355.2:629.113.006, Nov. 1995.

"Performance of Dry Cells", by C. Hambuechen, Preprint of *Am. Electrochem. Soc.*, Apr. 18–20, 1912, paper No. 19, pp. 1–5.

"A Bridge for Measuring Storage Battery Resistance", by E. Willihncanz, *The Electrochemical Society*, preprint 79–20, Apr. 1941, pp. 253–258.

National Semiconductor Corporation, "High Q Notch Filter", 3/69, Linear Brief 5, Mar. 1969.

Burr–Brown Corporation, "Design A 60 Hz Notch Filter with the UAF42", 1/94, AB–071, 1994.

National Semicondutor Corporation, "LMF90–4$^{th}$–Order Elliptic Notch Filter", 12/94, RRD–B30M115, Dec. 1994.

National Semiconductor Corporation, "High Q Notch Filter", 3/69, Linear Brief 5, Mar. 1969.

Burr–Brown Corporation, "Design A 60 Hz Notch Filter with the UAF42", 1/94, AB–071, 1994.

National Semiconductor Corporation, "LMF90–4$^{th}$–Order Elliptic Notch Filter", 12/94, RRD–B30M115, Dec. 1994.

"Alligator Clips with Wire Penetrators"*J.S. Popper, Inc.* product information, downloaded from http://www.jspopper.com/ , undated.

"#12: Lm78S40 Simple Switcher DC to DC Converter", *ITM e–Catalog*, downloaded from http://www.pcbcafe.com, undated.

"Simple DC—DC Converts Allows Use of Single Battery", *Electronix Express*, downloaded from http://www.elexp.com/t_dc—dc.htm, undated.

"DC—DC Converter Basics", *Power Designers*, downloaded from http://www.powederdesigners.com/InforWeb.design_center/articles/DC—DC converter.shtm, undated.

* cited by examiner

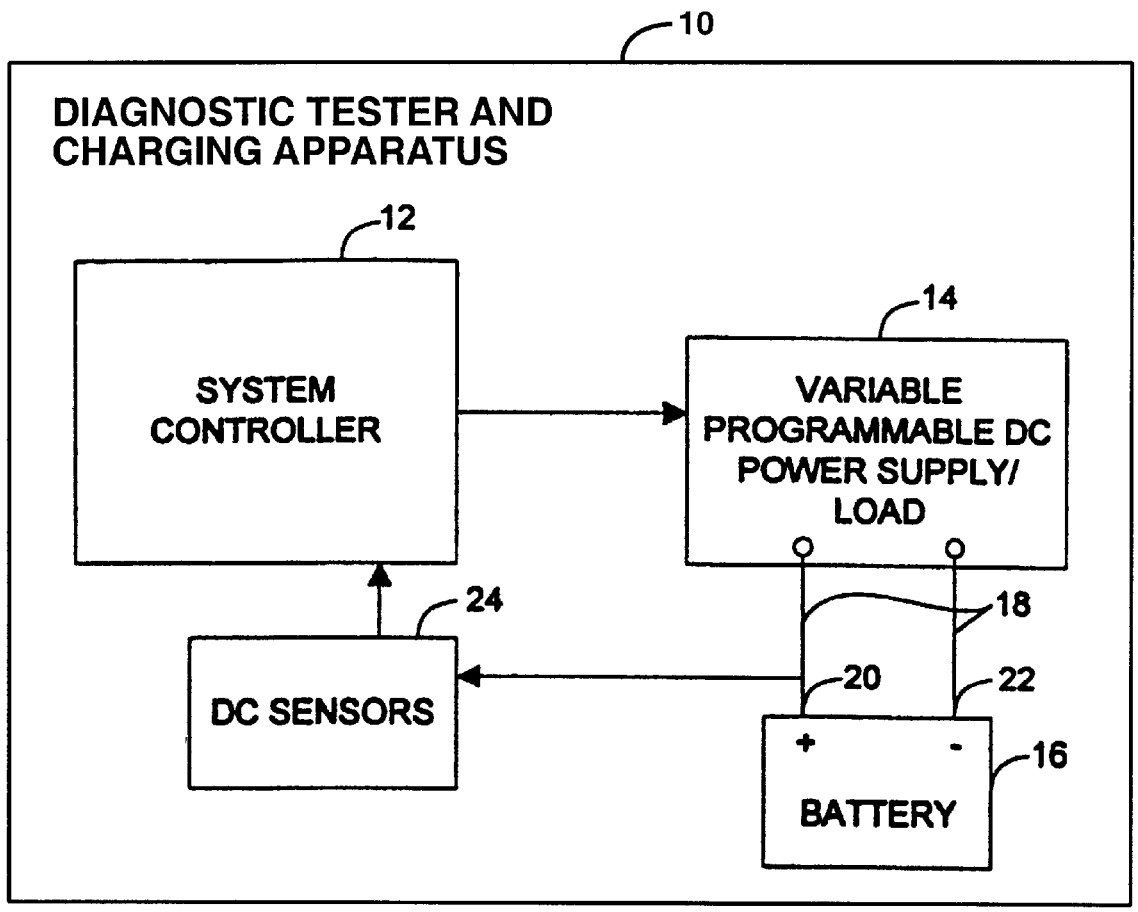
FIG._1

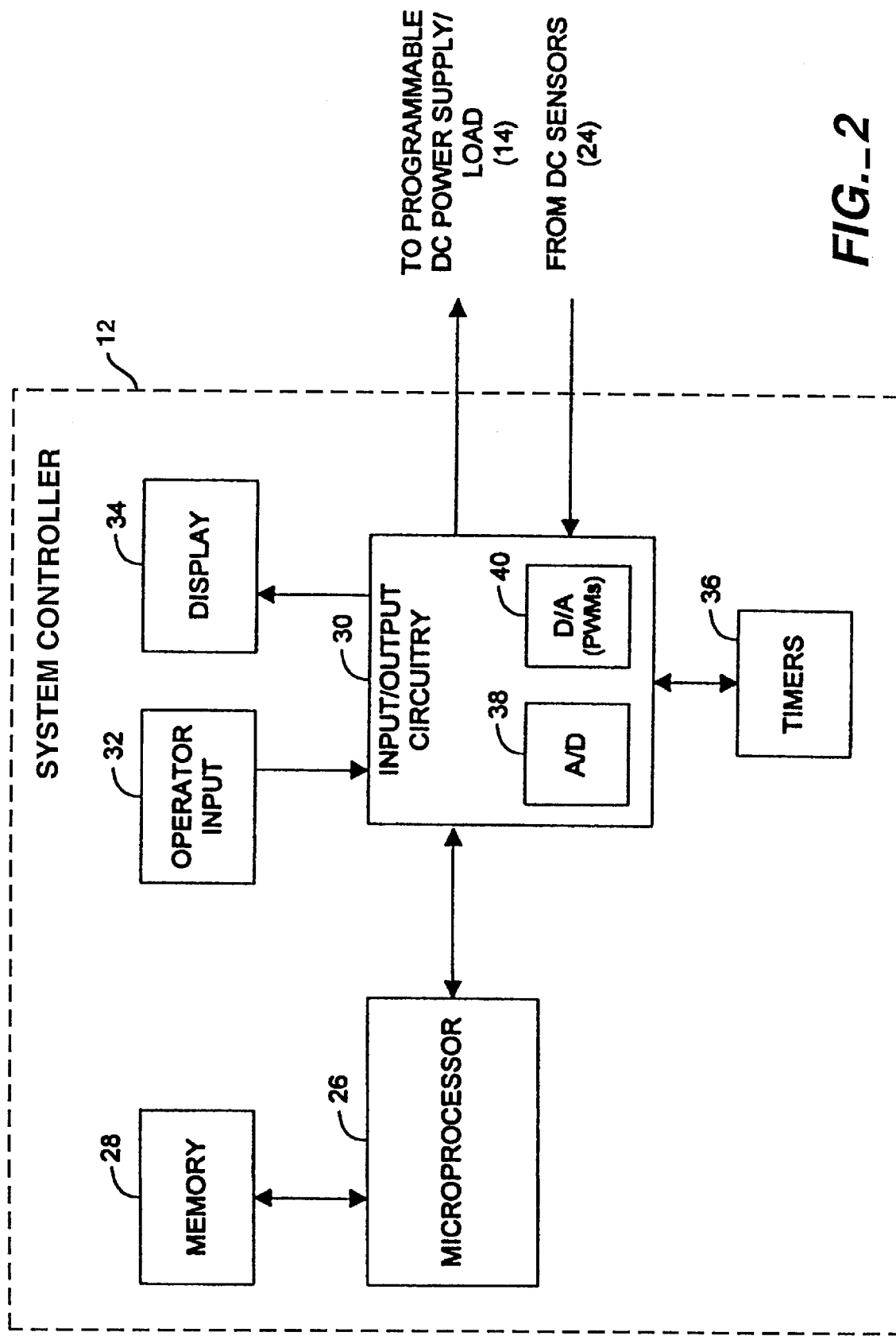
FIG._2

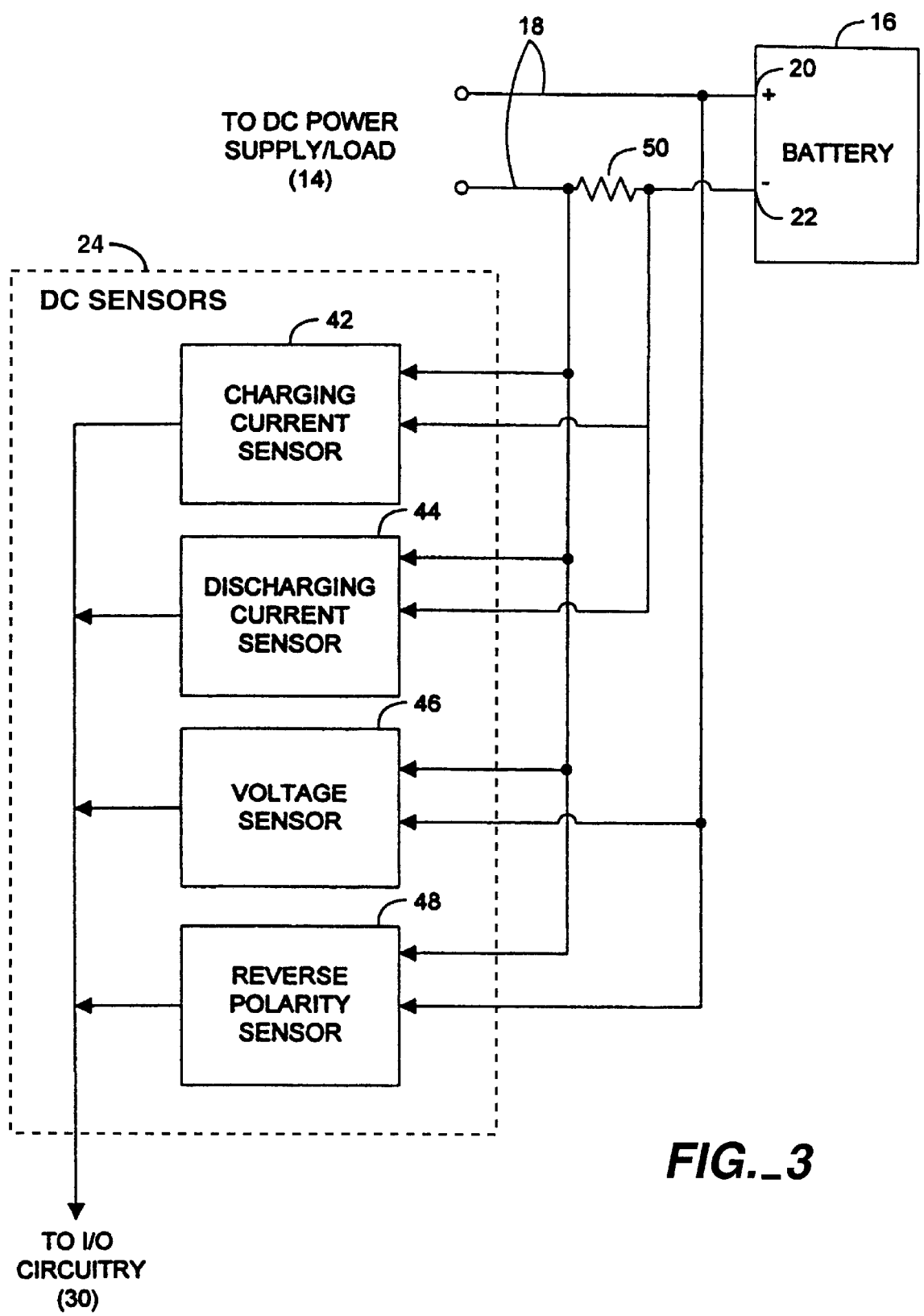
FIG._3

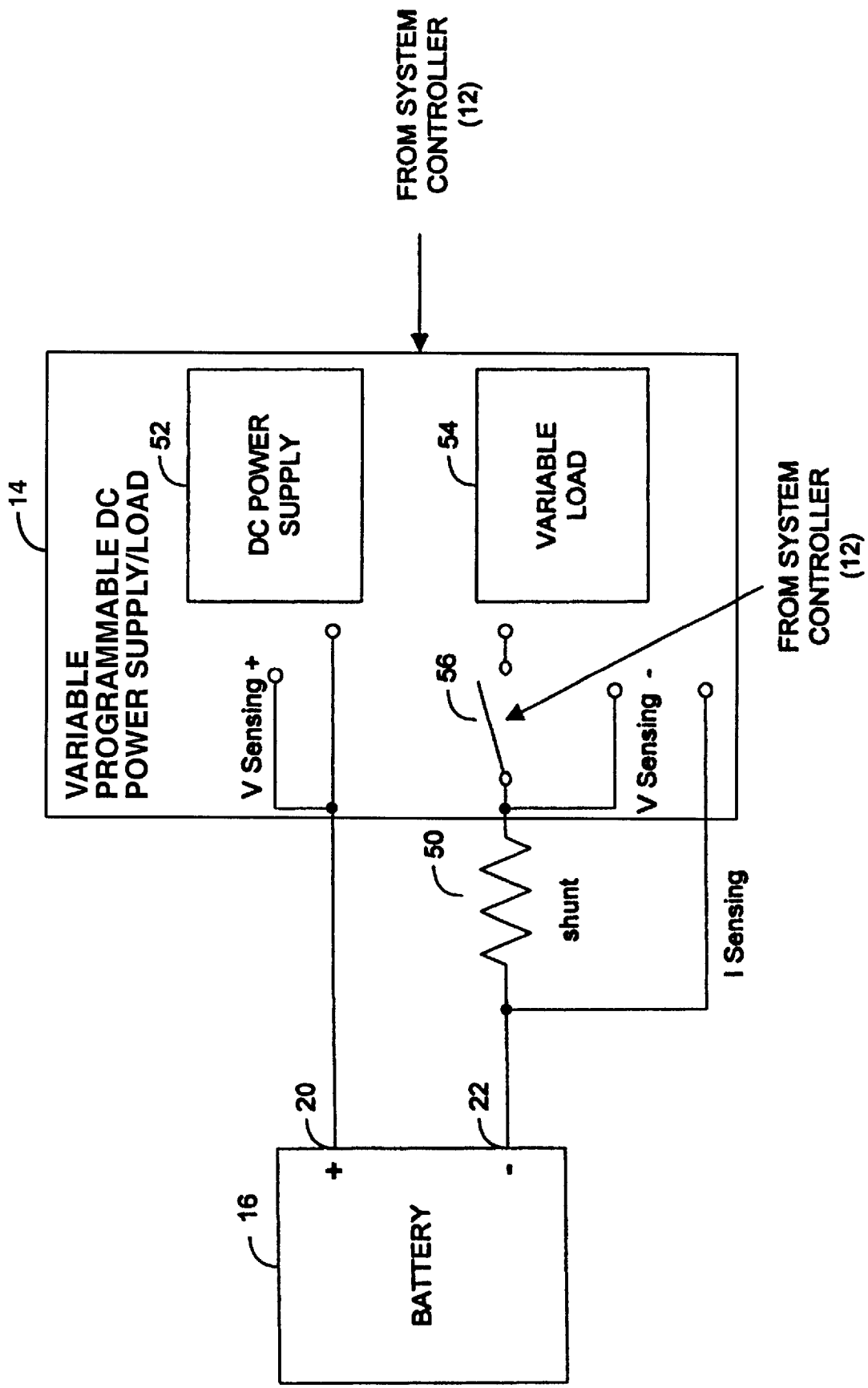
FIG._4

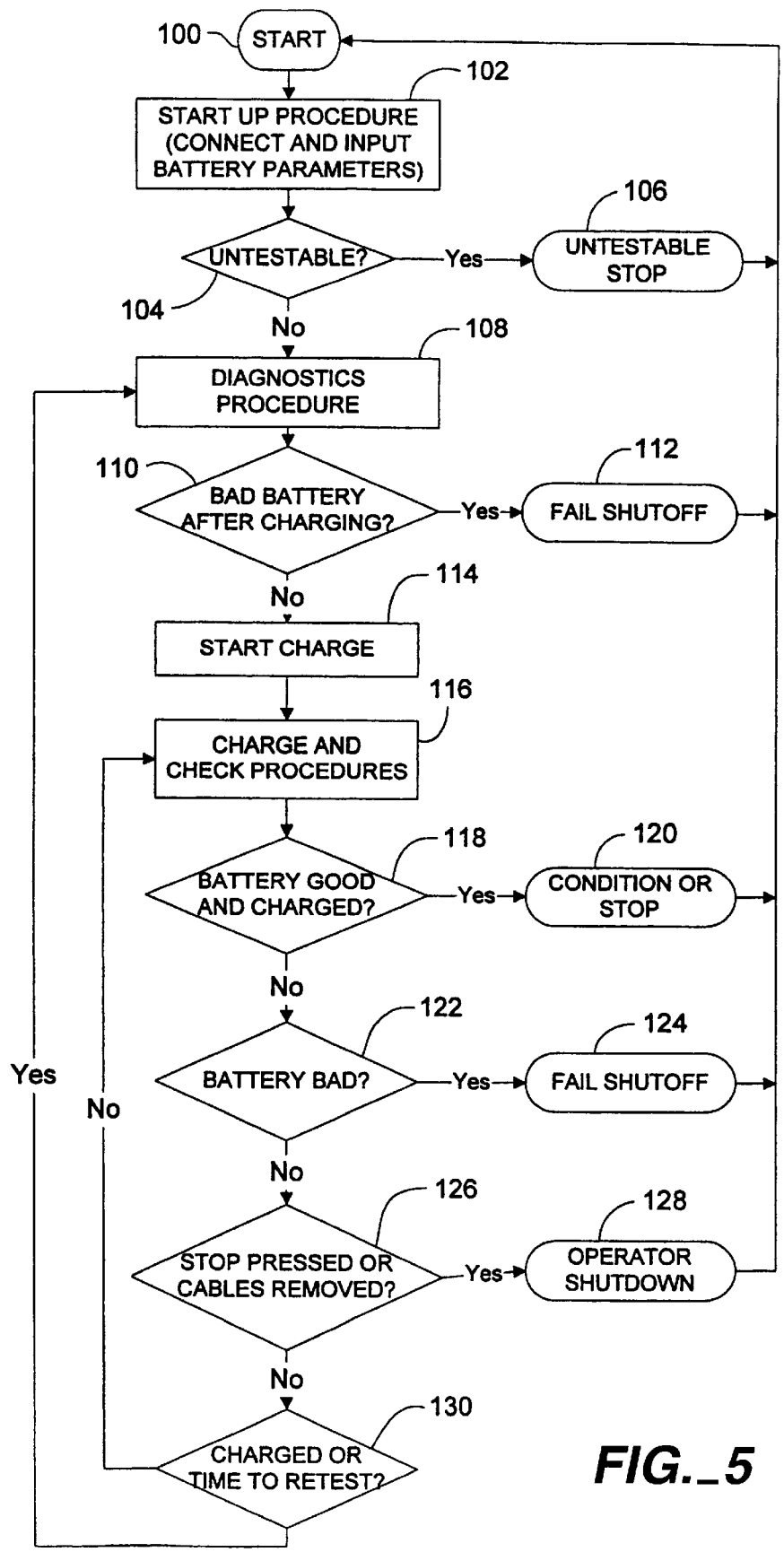
FIG._5

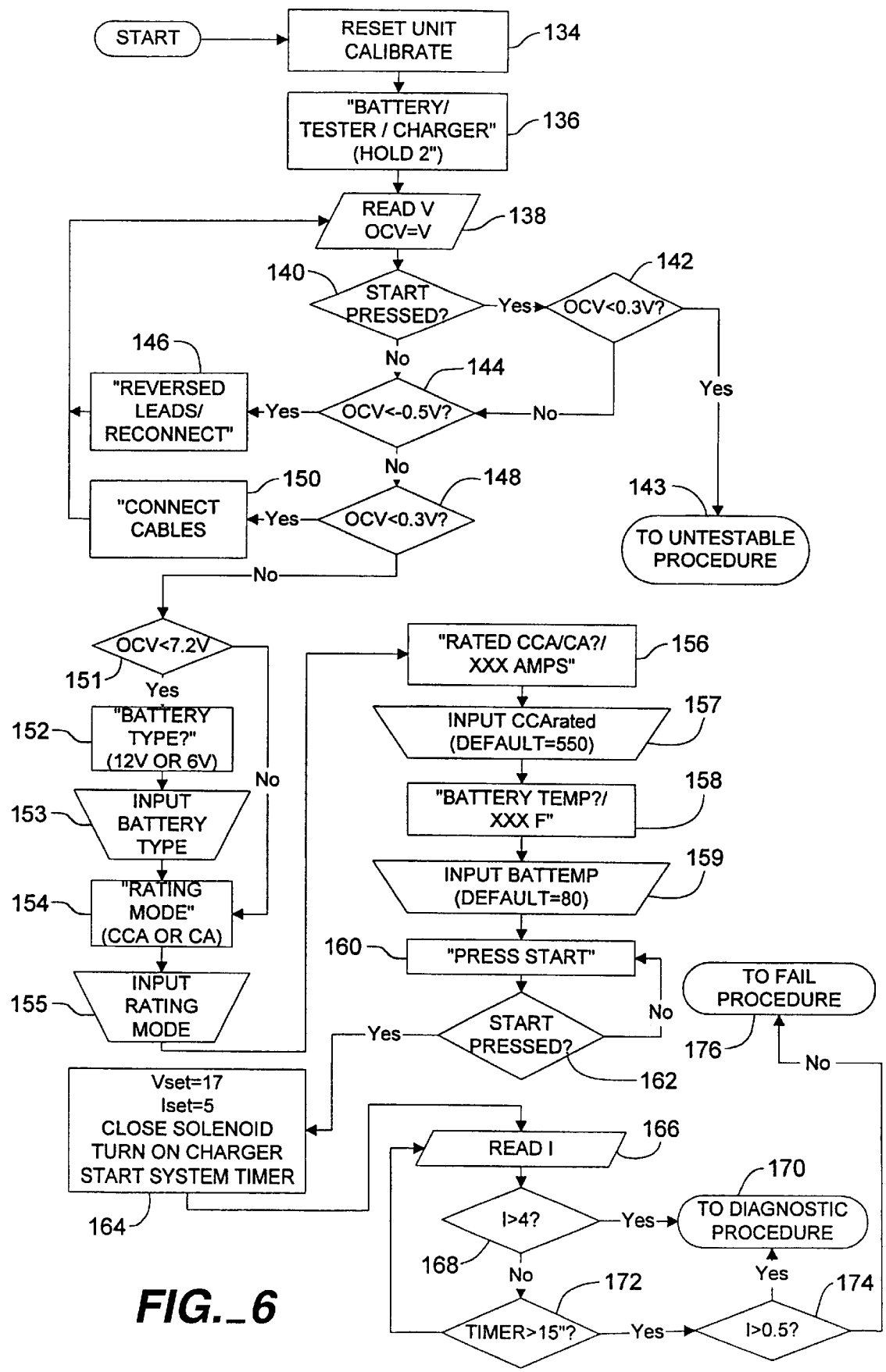
FIG._6

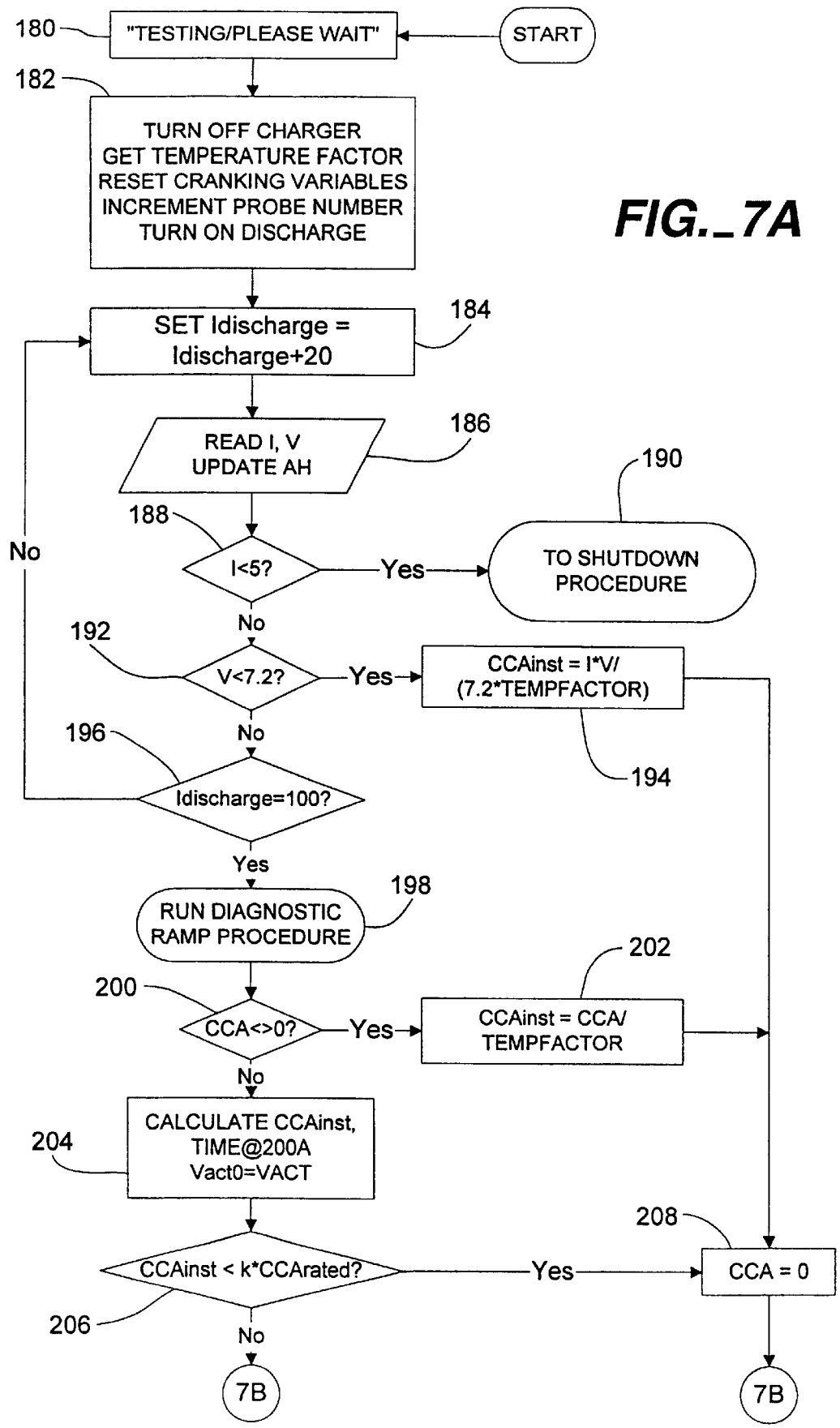
FIG._7A

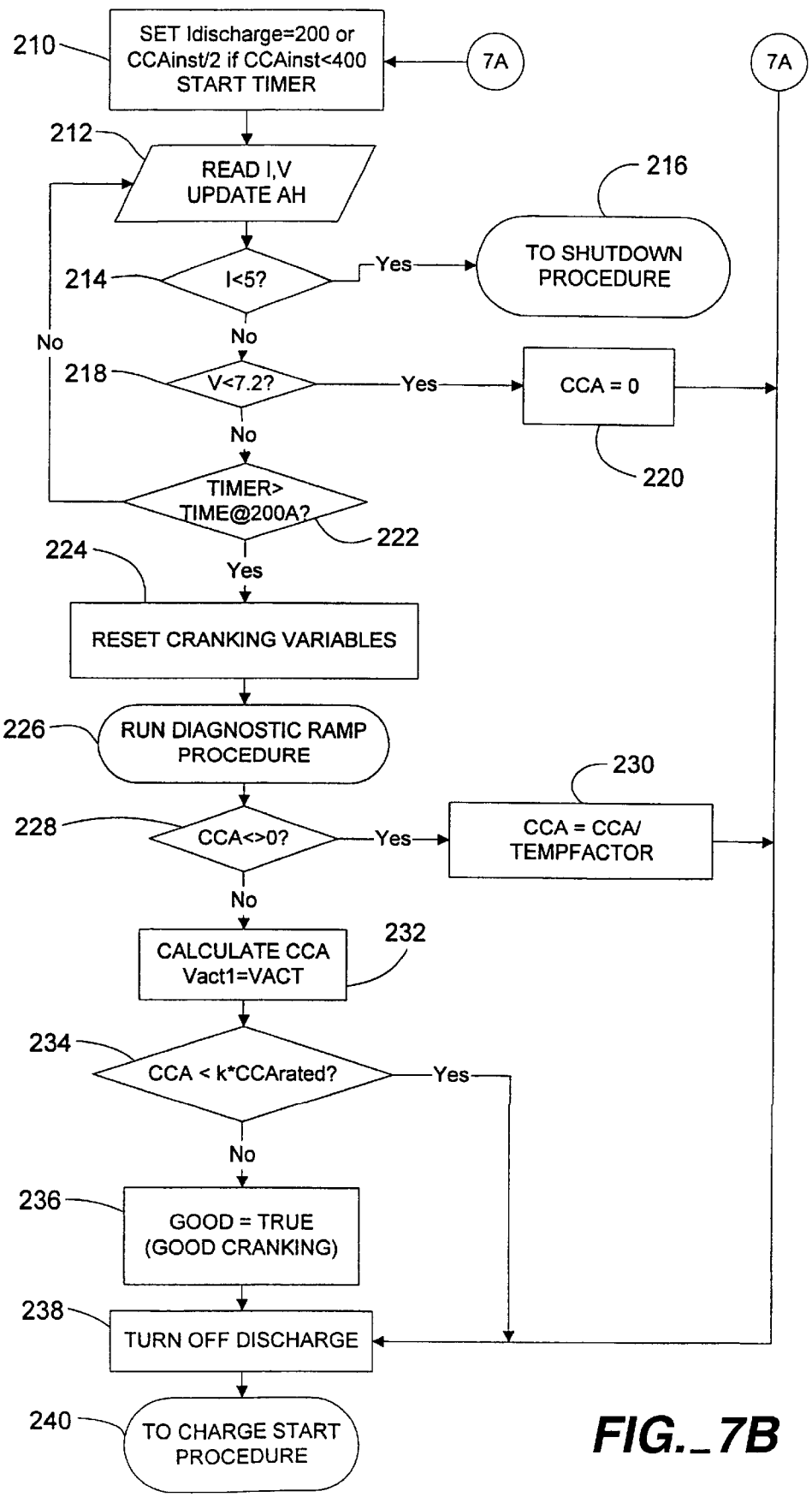
FIG._7B

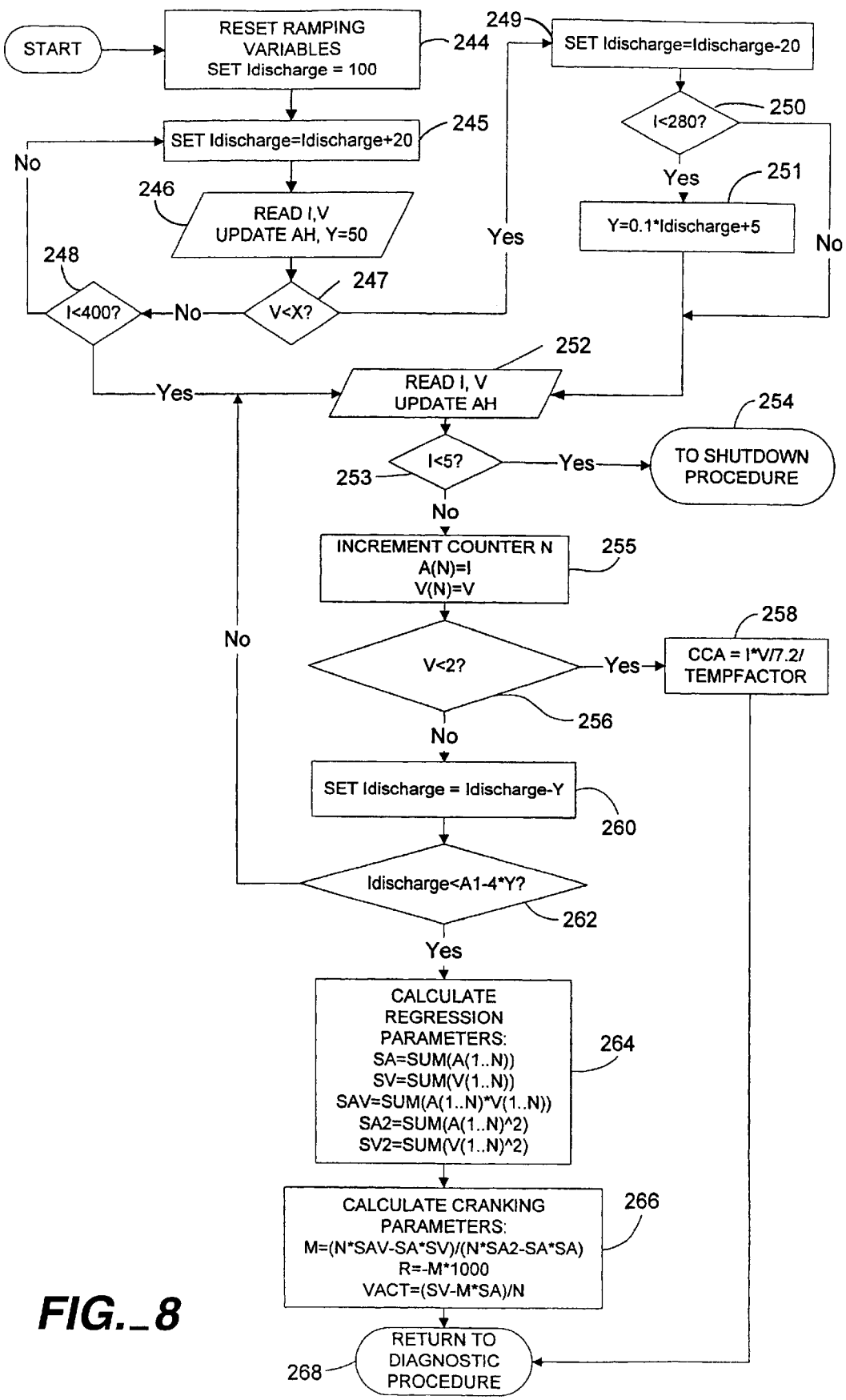
FIG._8

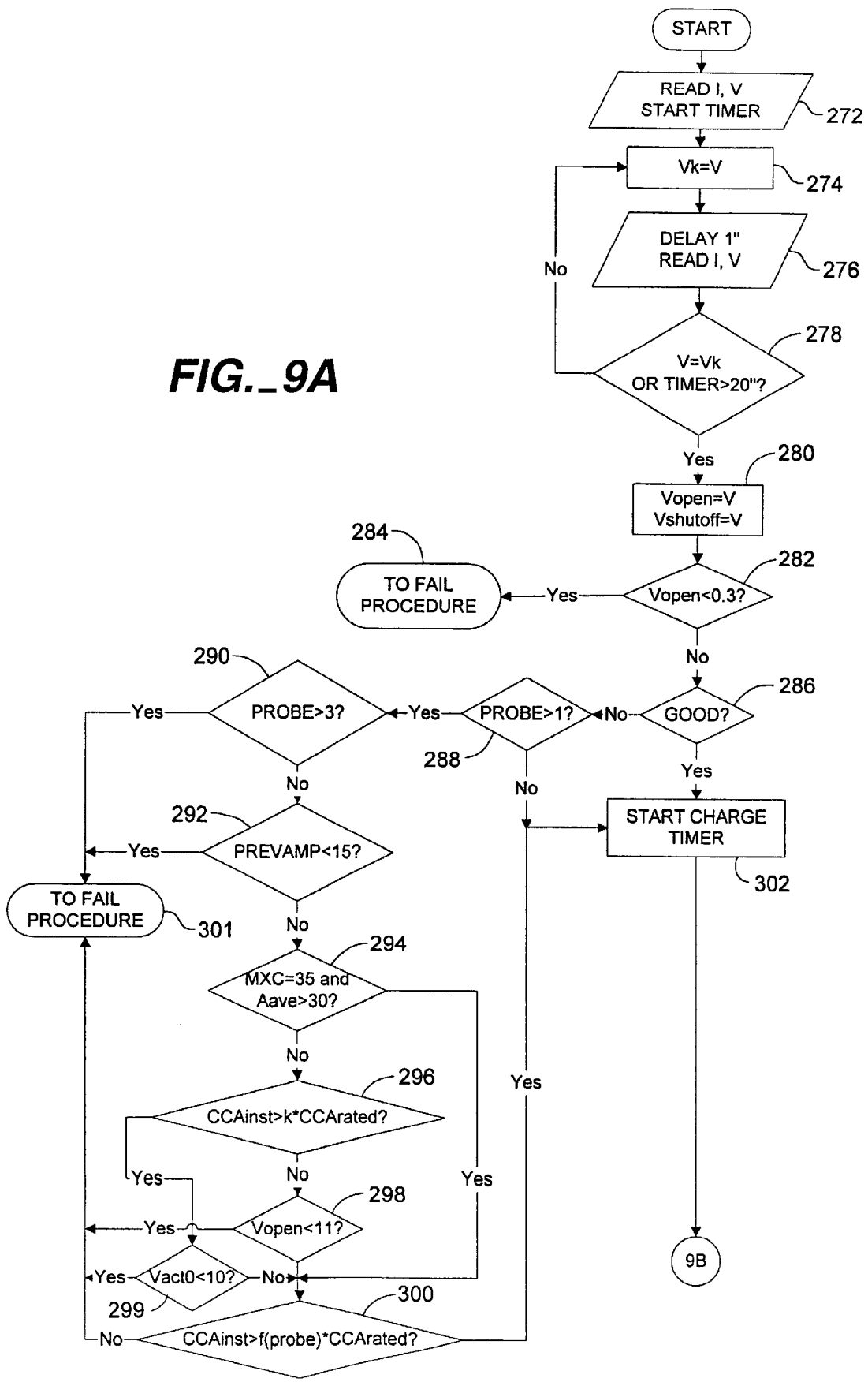
FIG._9A

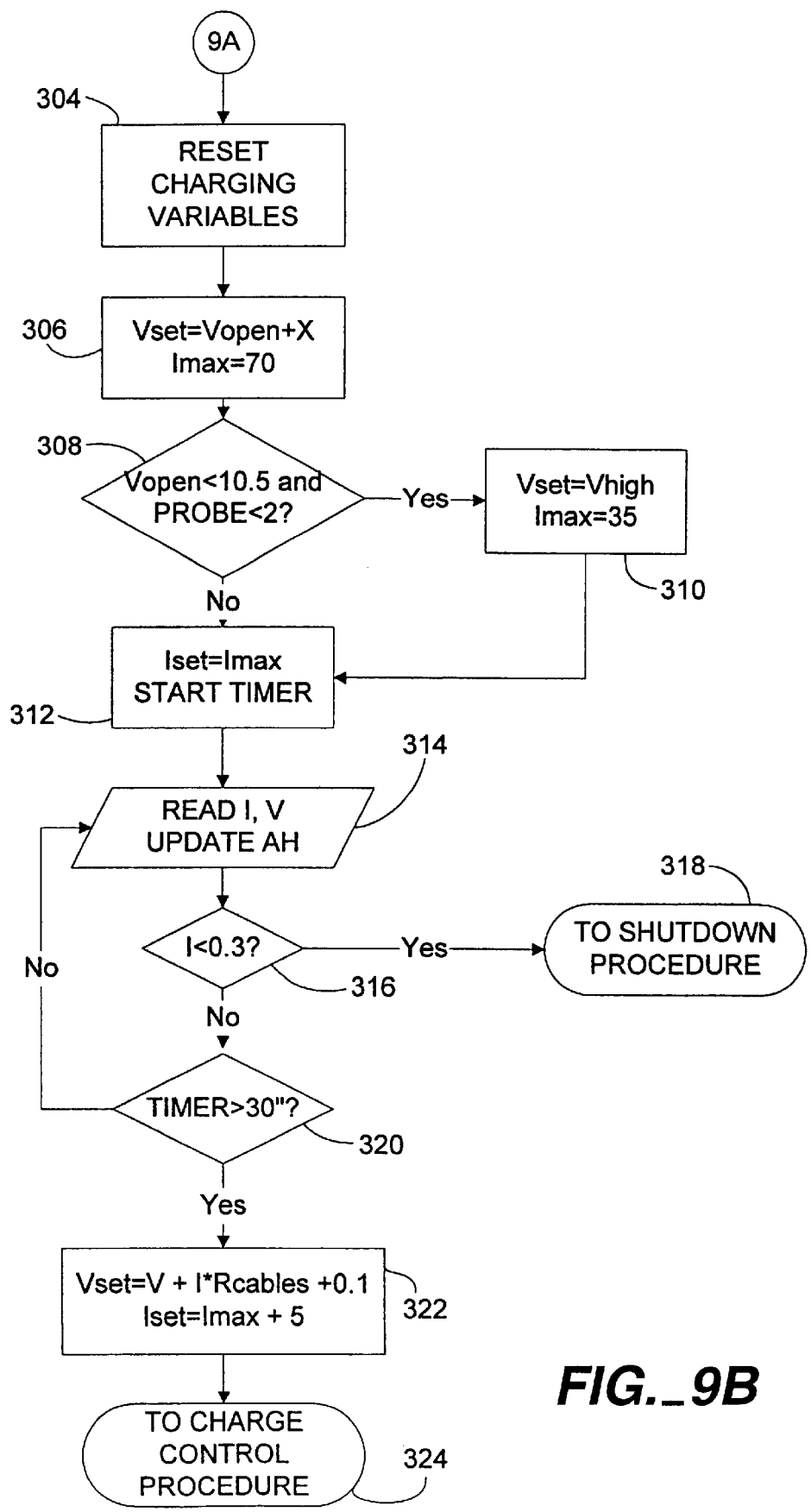
FIG._9B

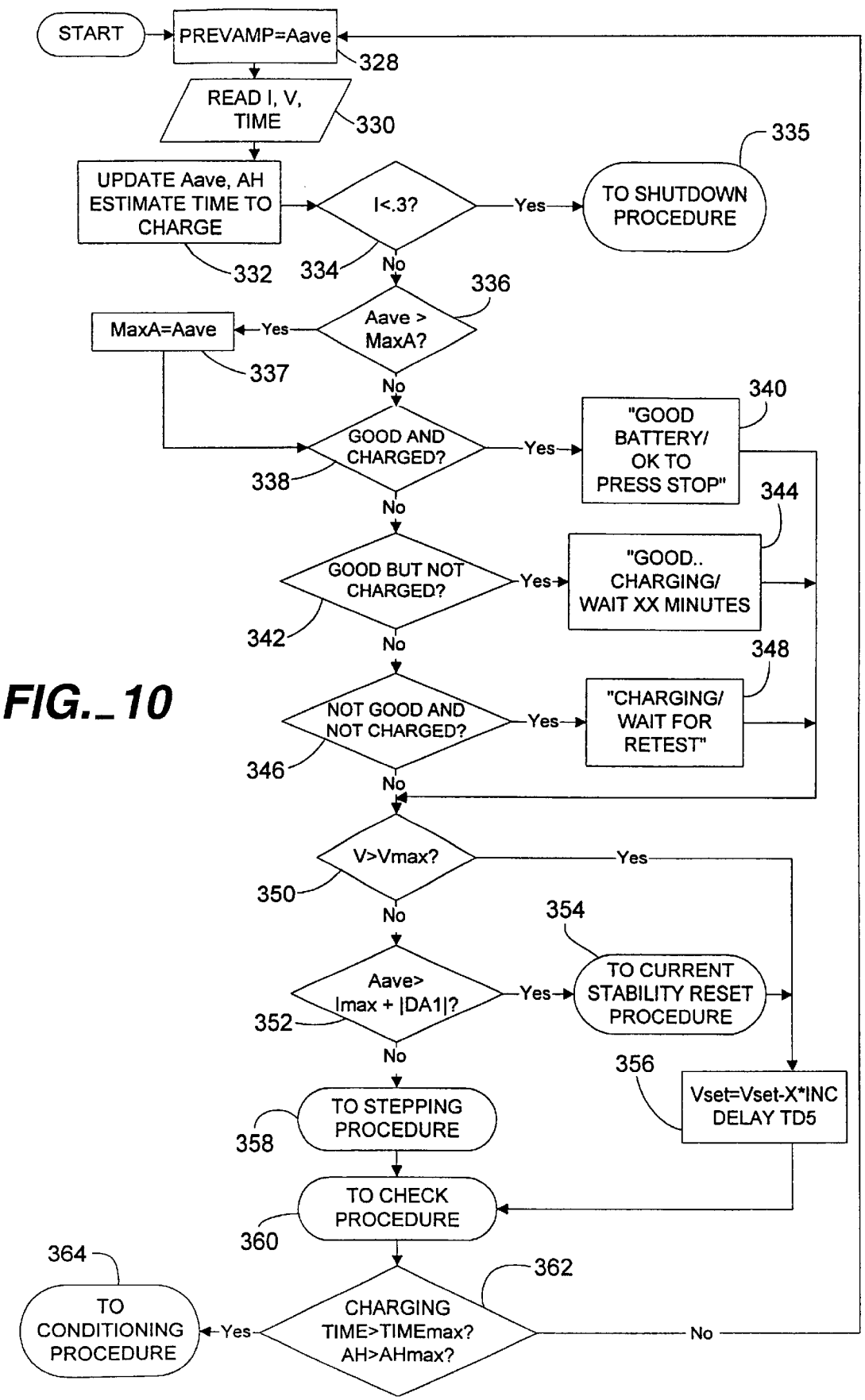
FIG._10

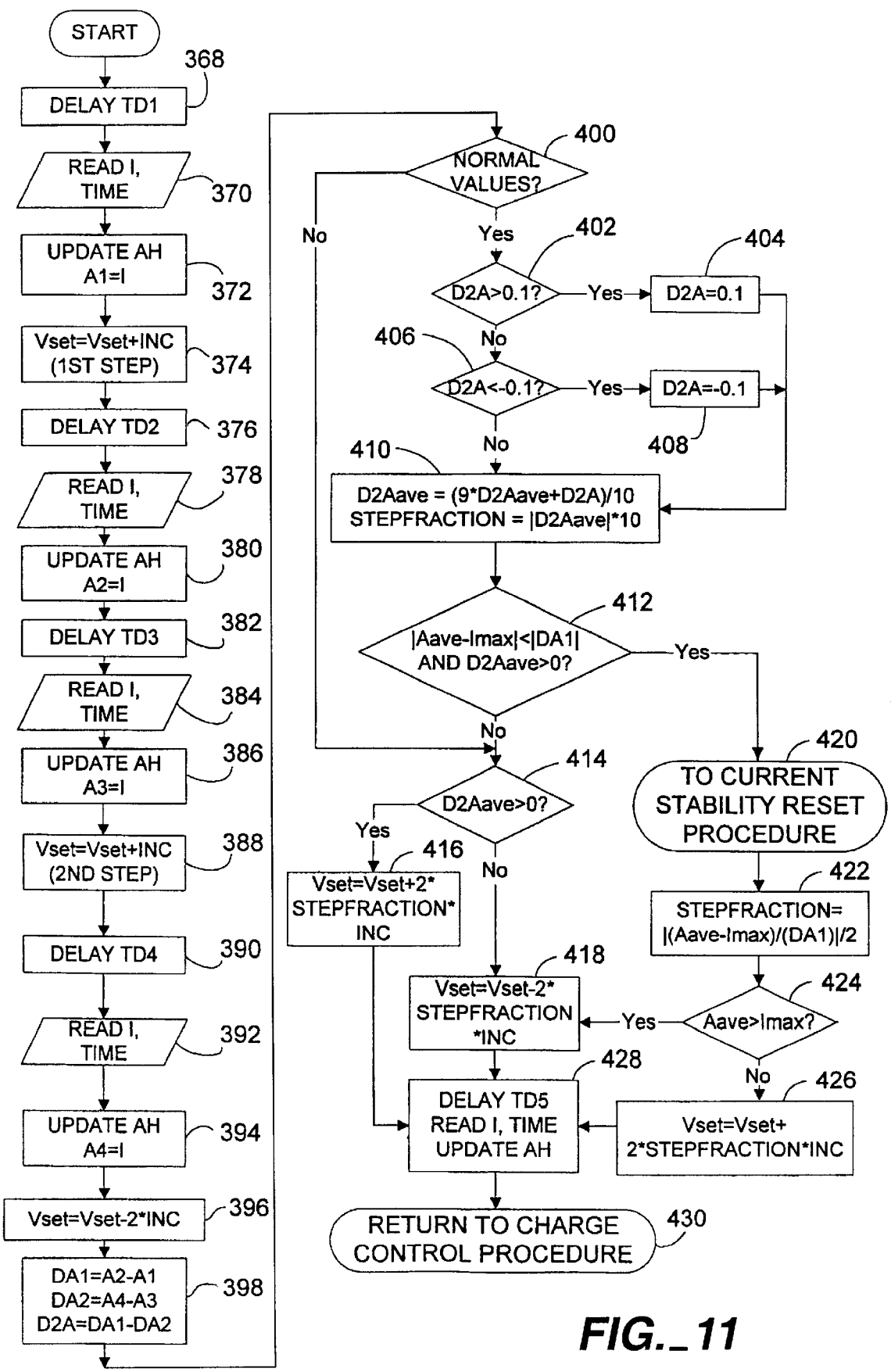
FIG._11

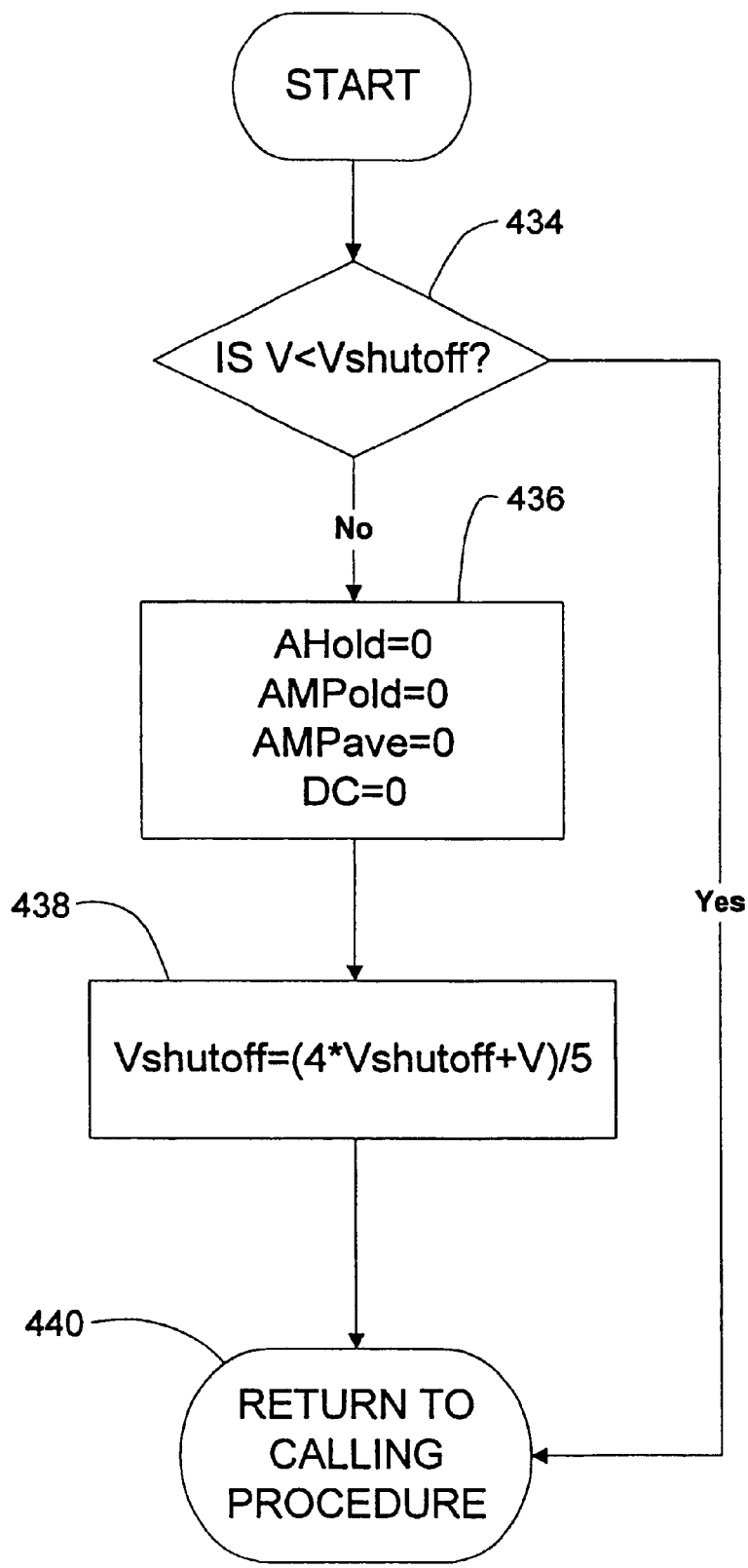
FIG._12

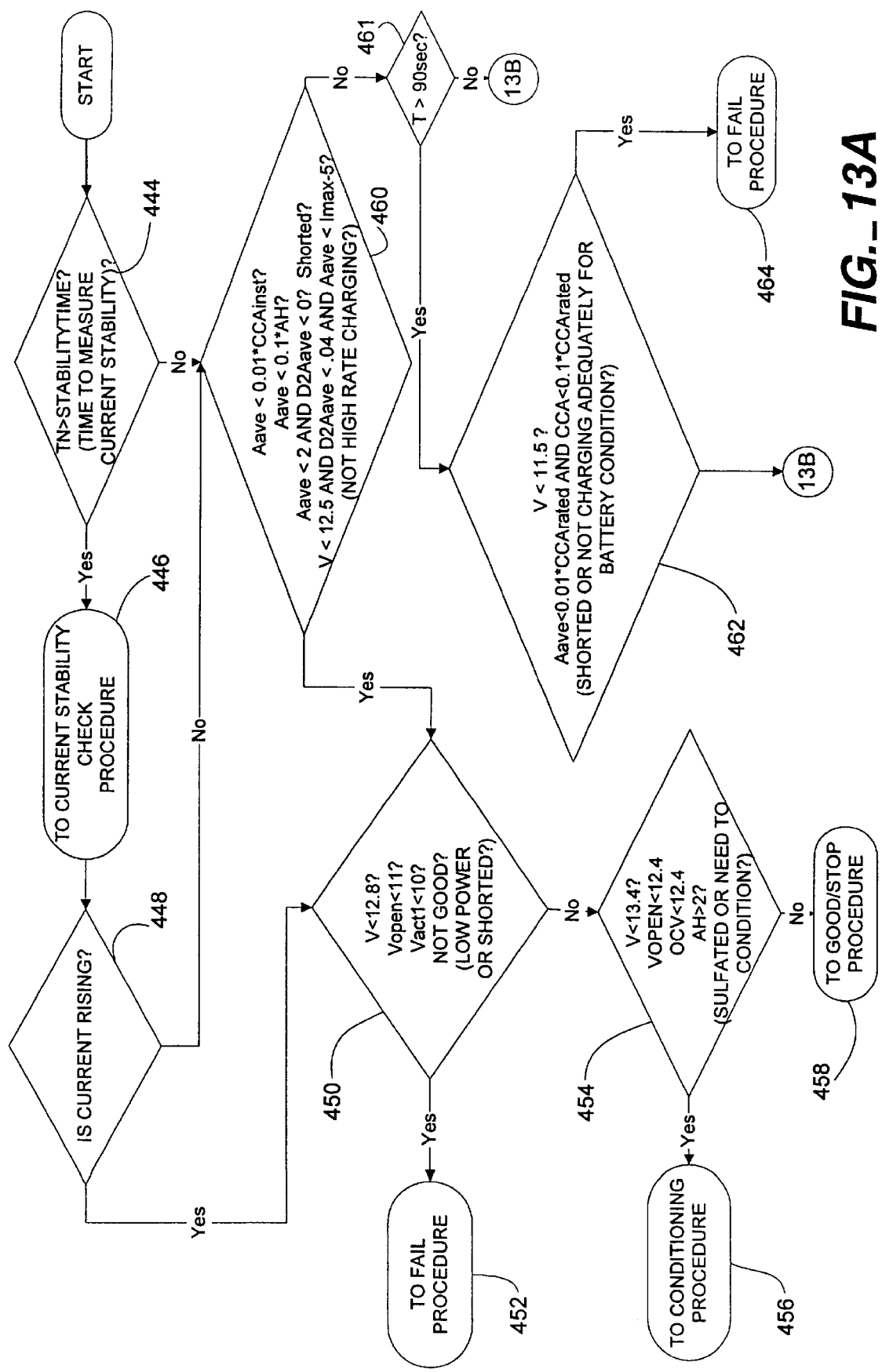
FIG._13A

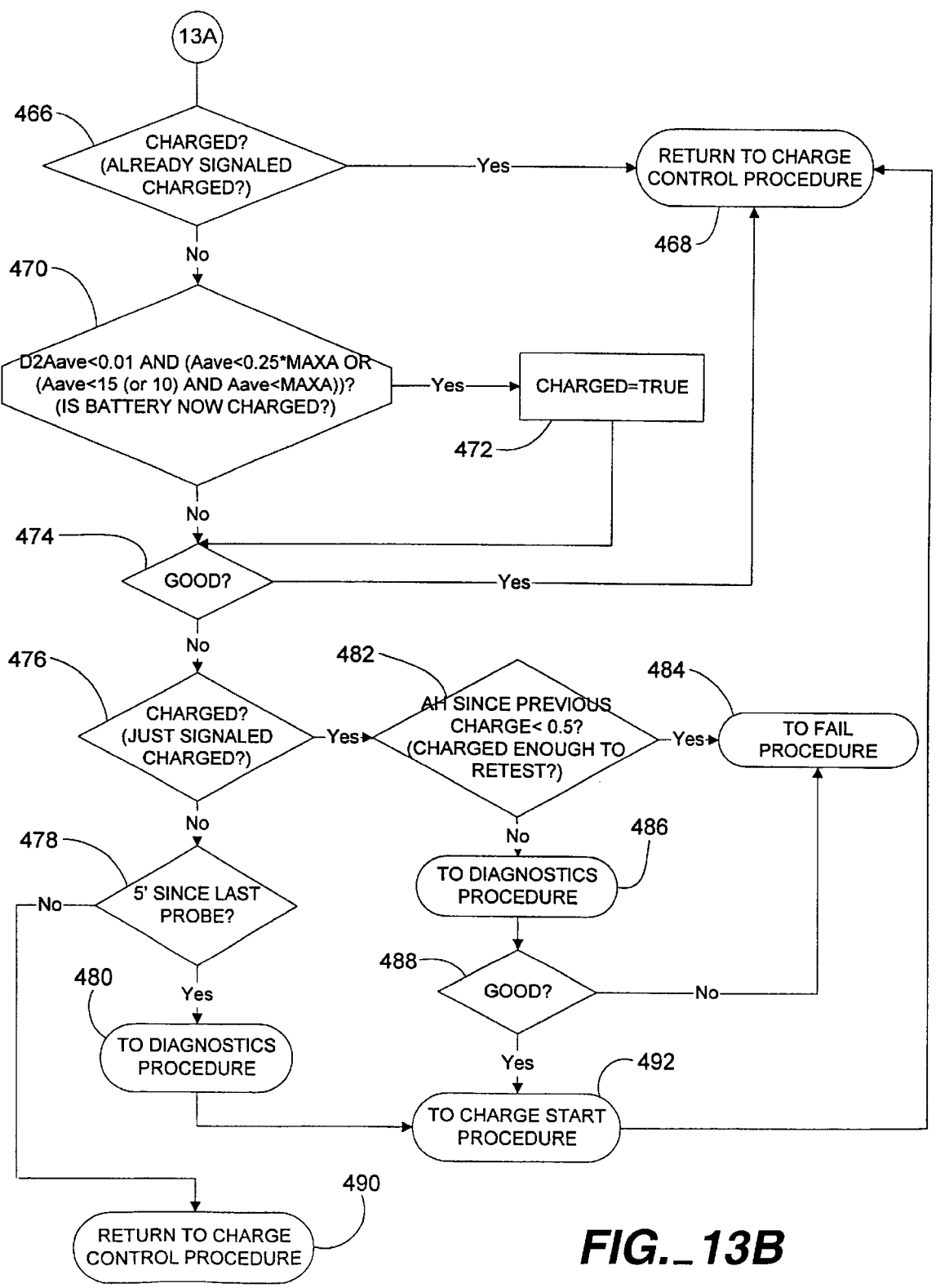
FIG._13B

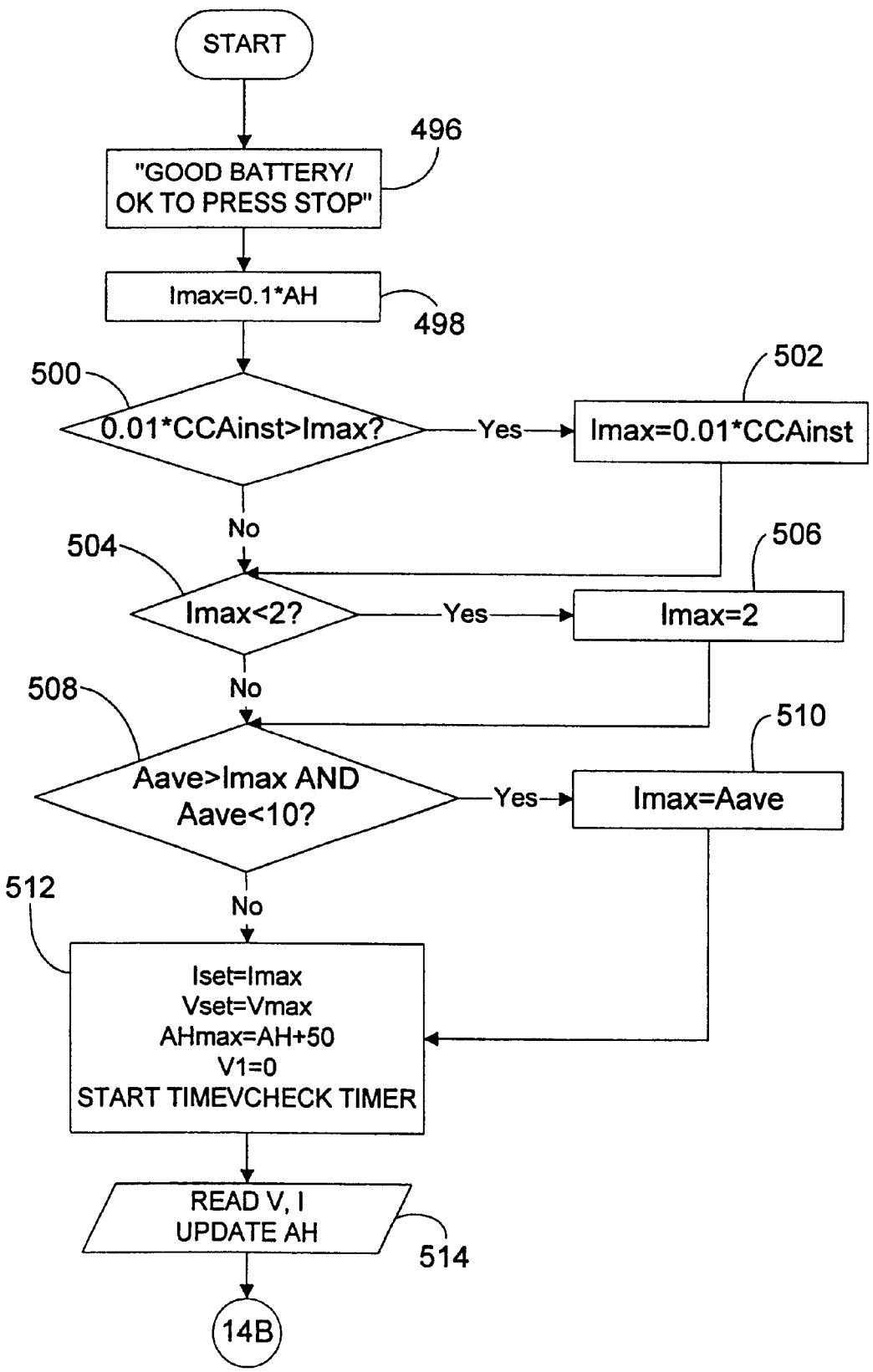
FIG._14A

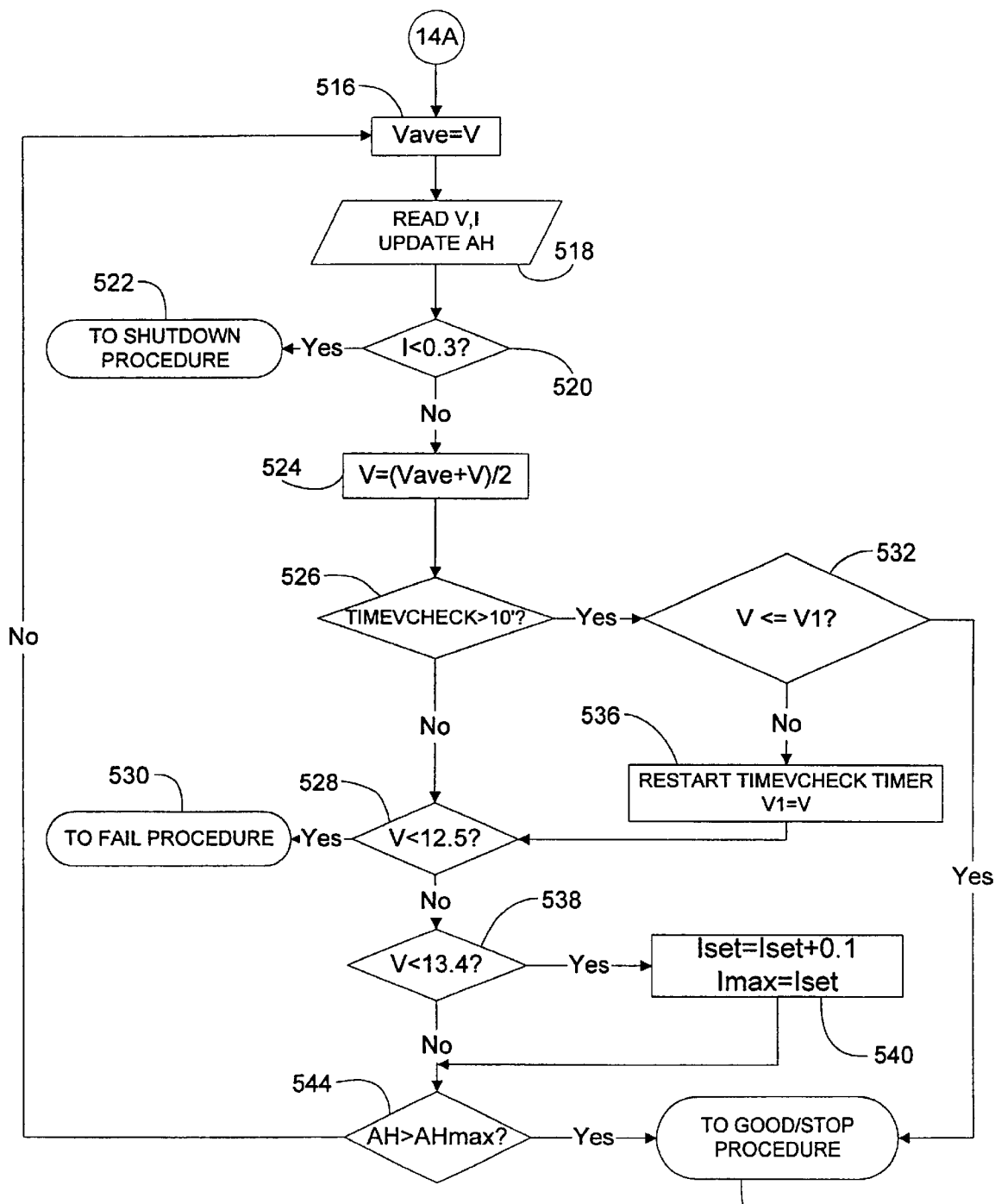
FIG._14B

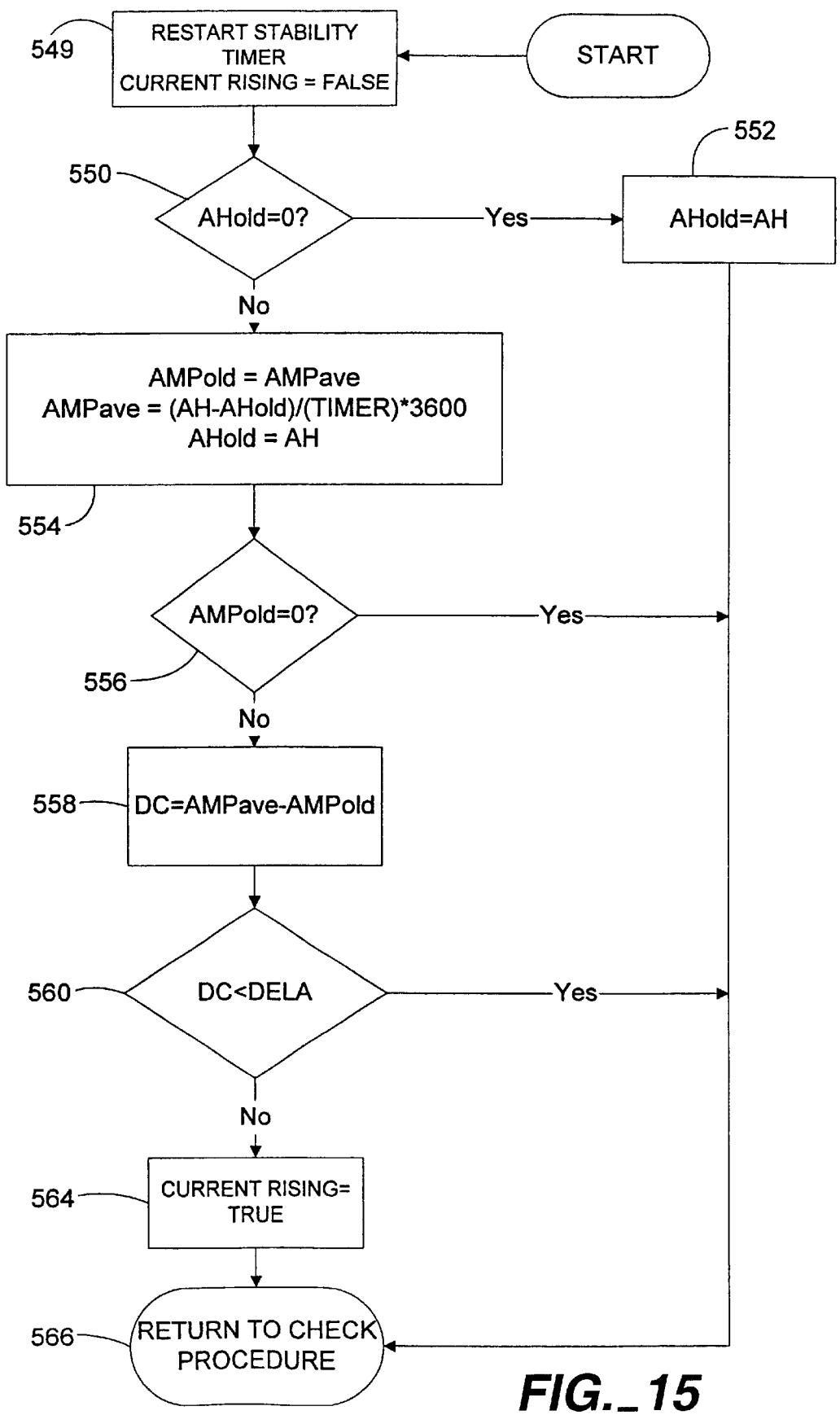
FIG._15

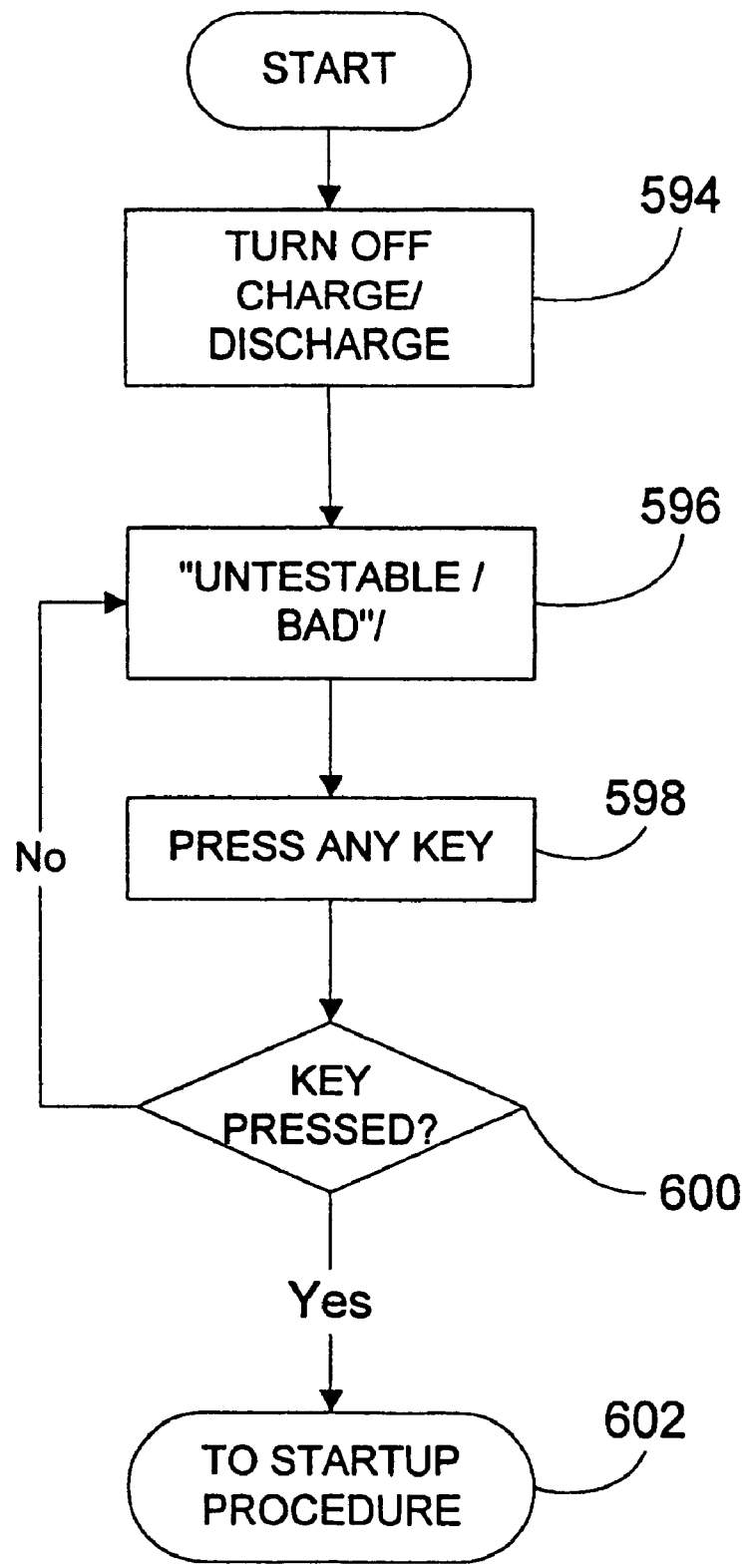
FIG._17

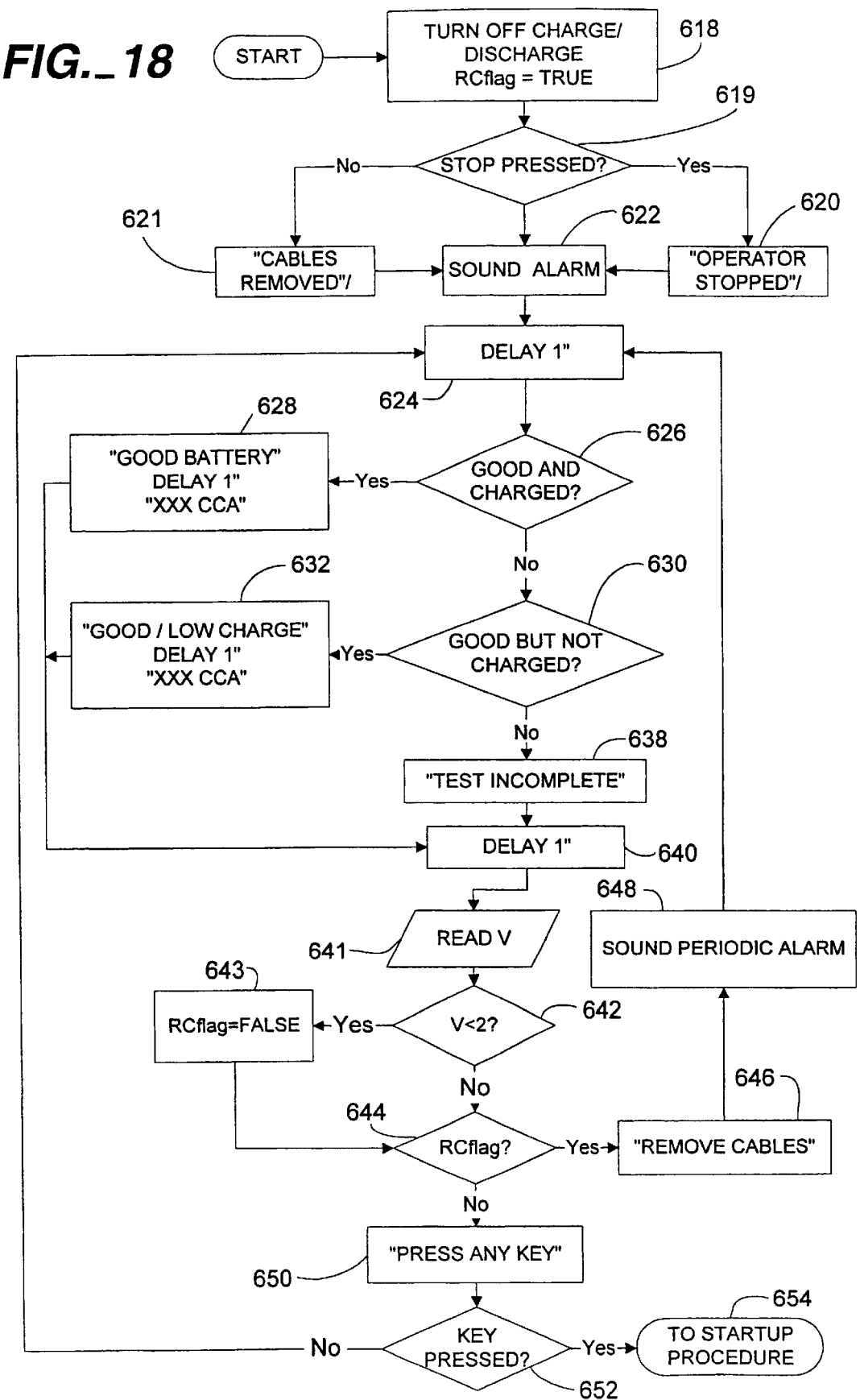
FIG._18

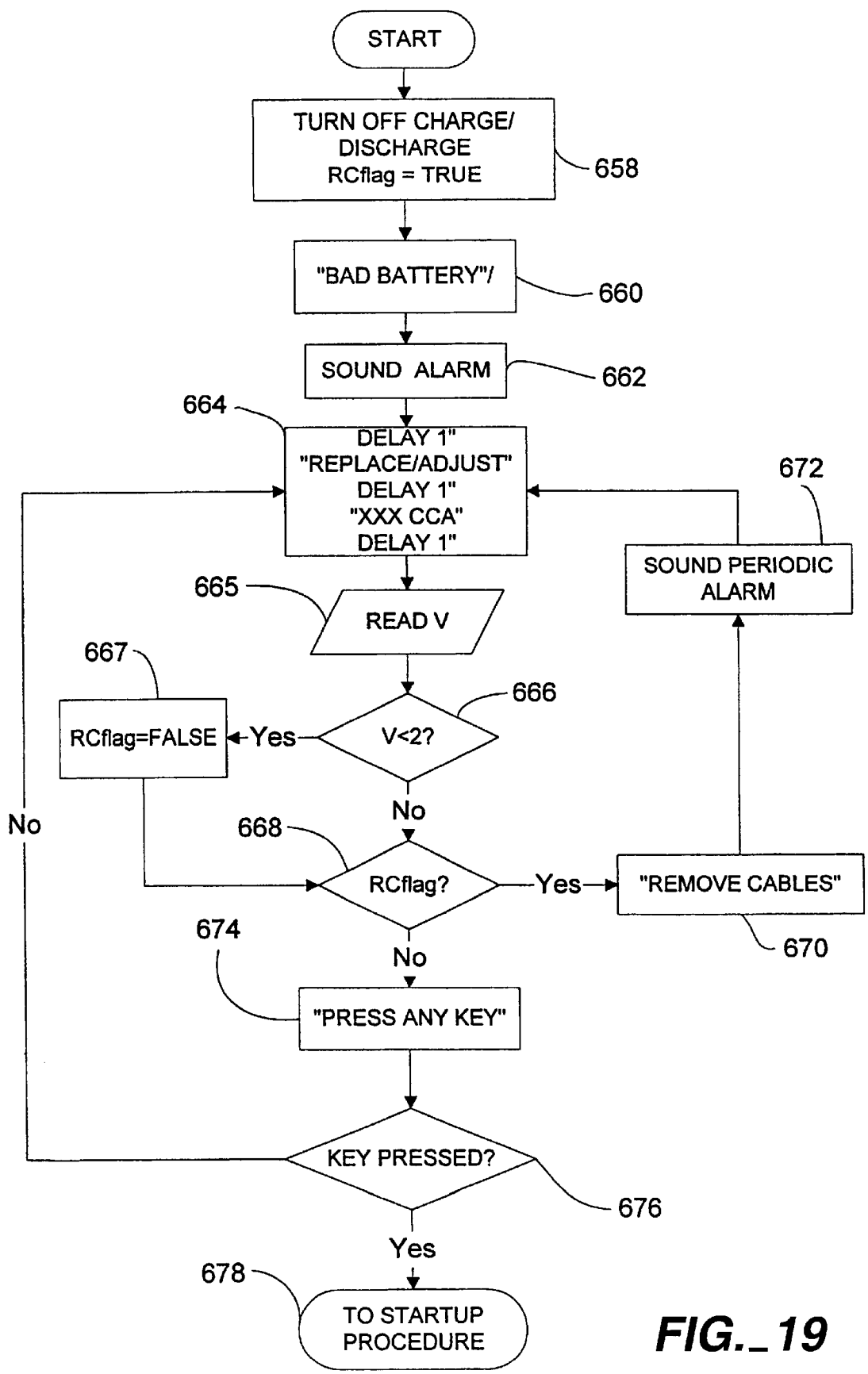
FIG._19

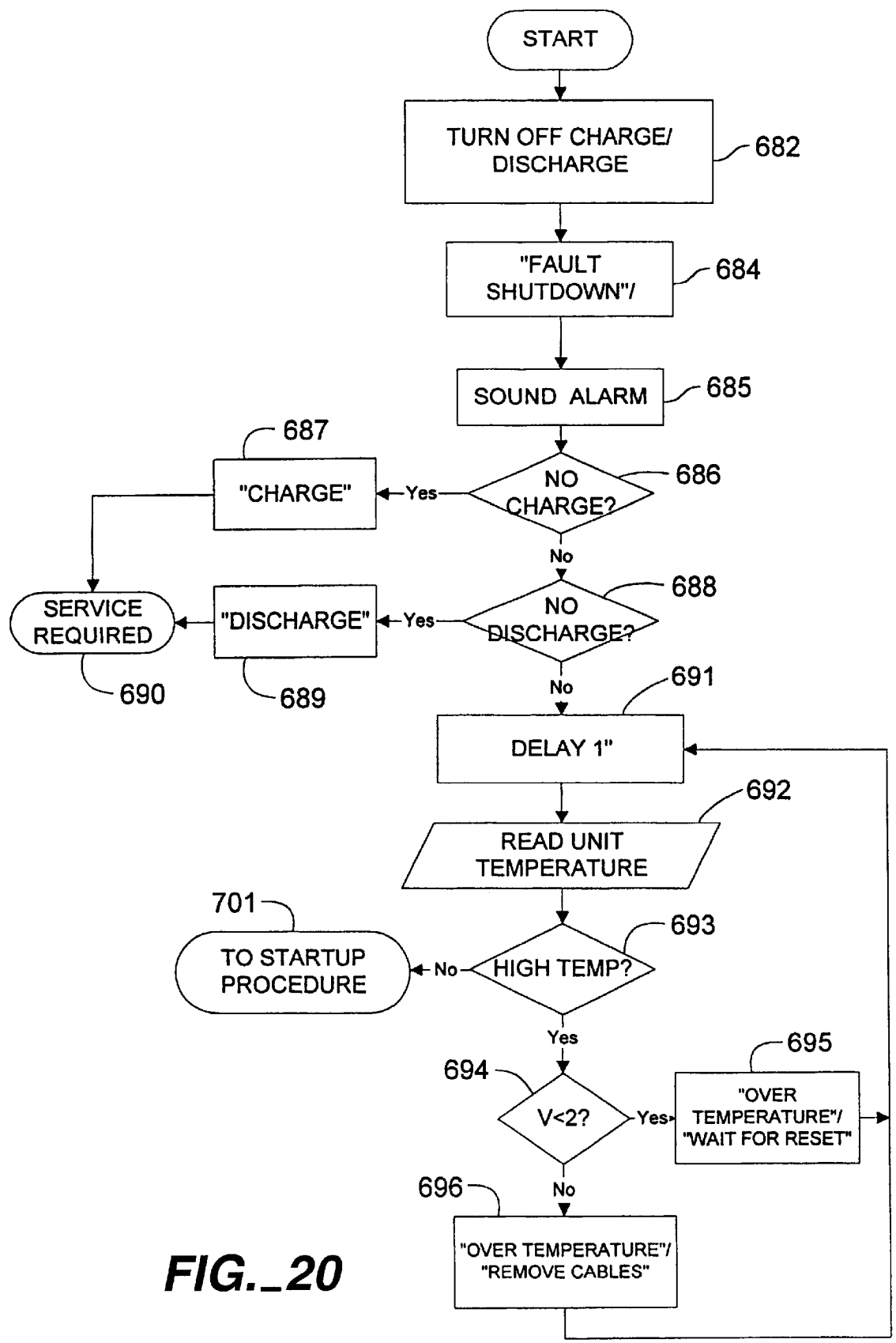
FIG._20

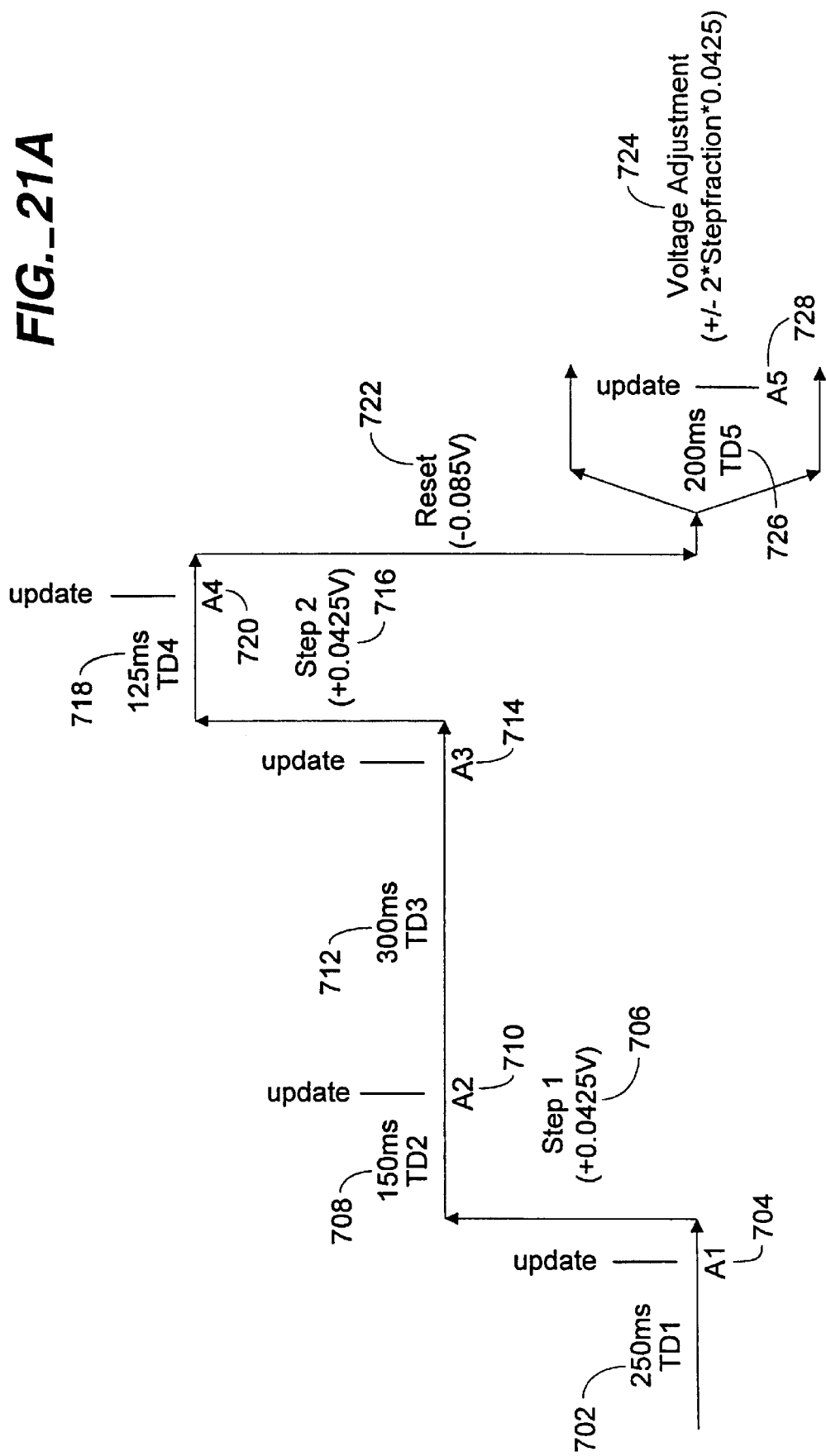
FIG._21A

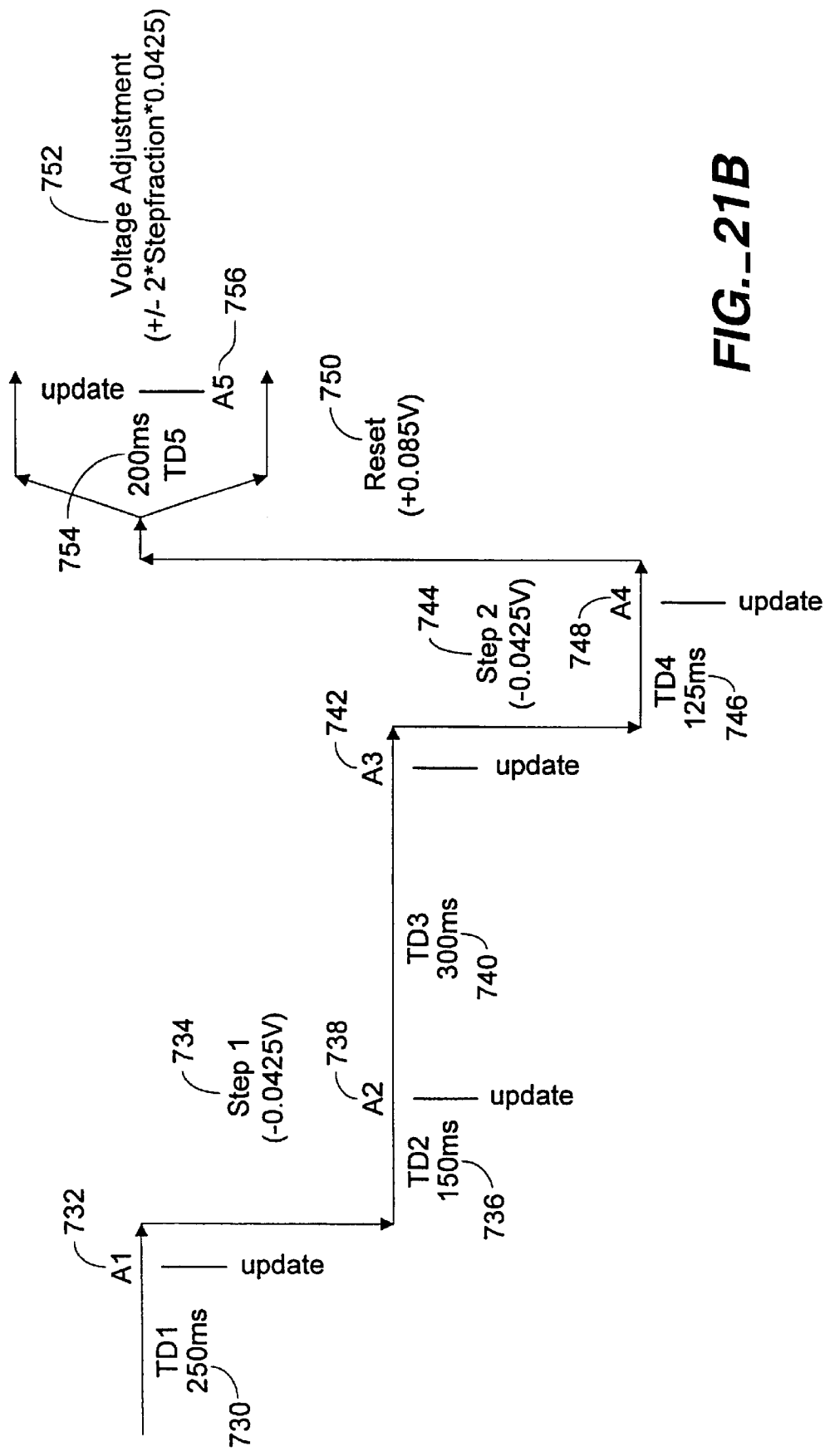
FIG._21B

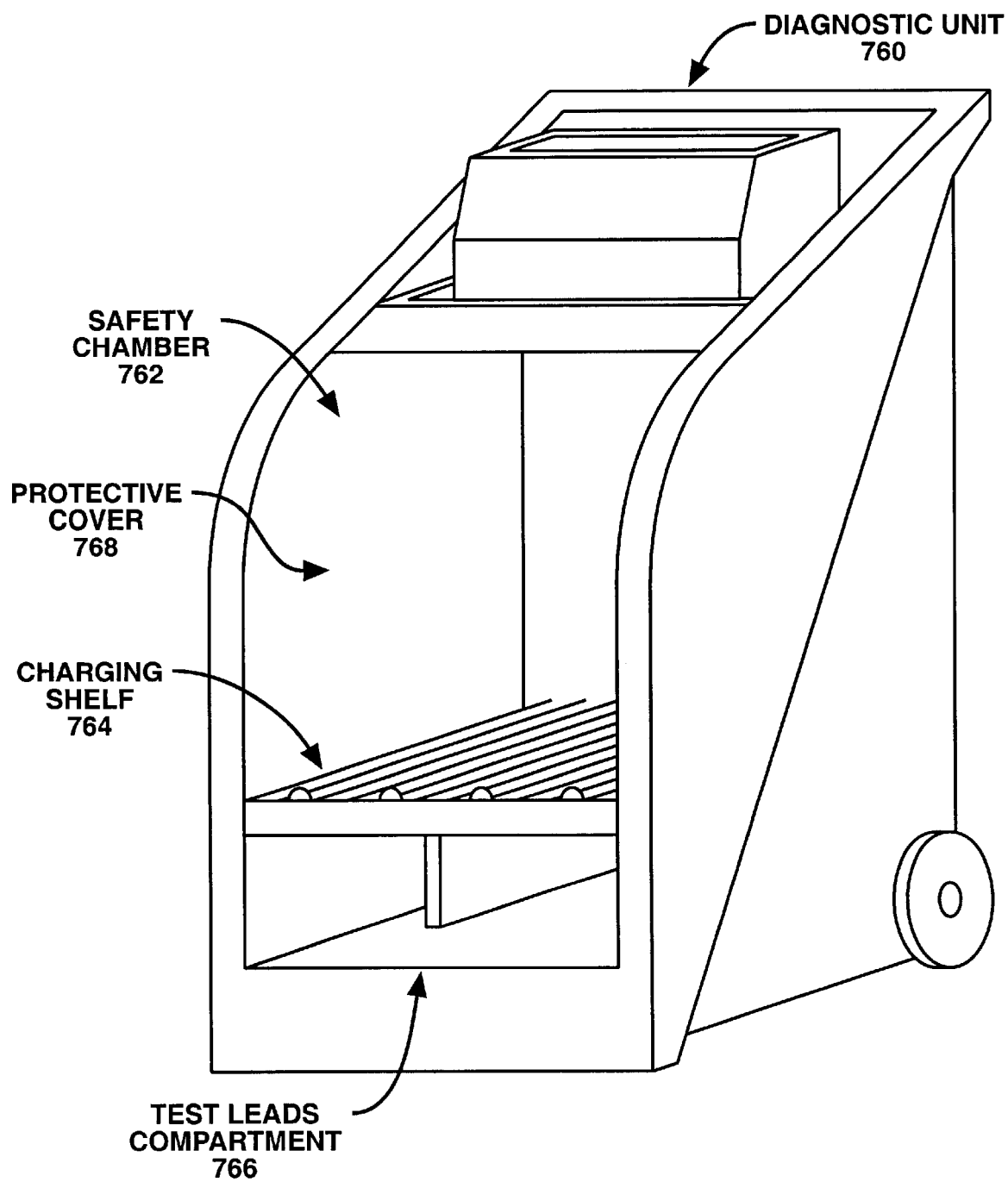
FIG._22

APPARATUS AND METHOD FOR CARRYING OUT DIAGNOSTIC TESTS ON BATTERIES AND FOR RAPIDLY CHARGING BATTERIES

CROSS-REFERENCE TO RELATED APPLICATIONS

This application is a divisional of U.S. application Ser. No. 09/361,487, filed Jul. 26, 1999 now U.S. Pat. No. 6,259,254, which is a continuation-in-part of U.S. application Ser. No. 60/094,308 filed on Jul. 27, 1998, still pending.

FIELD OF THE INVENTION

This invention relates generally to the field of lead-acid batteries, and, more particularly, to an apparatus and a method for rapidly carrying out highly discriminating diagnostic tests on lead-acid batteries and charging such batteries if appropriate.

BACKGROUND OF THE INVENTION

Over the years, the purchasing habits of customers for starting, lighting and ignition ("SLI") batteries for automotive and other applications has changed. In the replacement market for SLI batteries, it has been increasingly the case that customers purchase such batteries at mass merchandisers and that warranties, often relatively expensive, are provided.

Accordingly, when a customer has problems starting his vehicle and suspects that the battery has gone bad, the customer returns the battery to the retailer or other location where the battery was purchased, and the warranty provided with the sale comes into play. A typical resolution is that the retailer takes the "bad battery" back, providing a new battery.

Indeed, it seems that the battery gets the blame as the cause for the problem regardless. Yet, it has been found that a significant proportion of batteries perceived as bad, and thus replaced per the warranty, are in fact lacking in charge, but capable of being recharged so as to provide satisfactory performance in use. The warranty cost to both the retailer or other battery seller and to the battery manufacturer is substantial.

For this reason, mass merchandisers and other battery sellers have turned to various types of testing devices in an attempt to effectively distinguish between good and bad batteries. Some battery testers which have been used carry out simple fixed discharges to determine battery power. Such testers are a variation of a standard load test in the industry which discharges the battery at half its cold cranking rate for 15 seconds and then looks for a minimum voltage adjusted for temperature to determine whether the battery being tested is good or not. While such a standard test is relatively simple and straightforward, this test requires that the battery be highly charged, a condition usually lacking in batteries that are giving problems for whatever reason and are thus perceived as being bad. Such a standard test also requires a large sustained discharge current which, of course, discharges the battery significantly. Many commercial diagnostic testing units include a fixed resistor which discharges all batteries at a close-to-constant rate that is well below the load test. Acceptable voltages are either fixed or relative to the cranking rate of the battery.

Testing units can also combine charging with the discharge test. Charging usually is done with a straight fixed voltage or current charger from a simple transformer with a rectifying diode which tries to force charge into the battery no matter what its condition. Yet, charging a battery can mask defects such as shorted cells and the like. Further, when batteries with shorted cells or bad internal connections are charged substantially, there can be a great deal of gassing and spewing of electrolyte which can be dangerous.

Another type of test unit proposed and used is a unit providing a conductance meter. Using relatively small current probes, the internal conductance of the battery is measured. This internal conductance is assumed to be proportional to the cranking rate of the battery, therefore providing a relative performance criteria. However, this type of test unit does not stress or polarize the battery enough to determine if there is sufficient power to sustain a discharge for more than a brief instant and cannot accurately predict the full-charge performance when the battery being tested is in a heavily discharged condition. Such an analysis also provides no information about the chargeability of the battery being tested.

Accordingly, despite the clear need for a highly discriminating lead-acid battery diagnostic test unit, it is believed that none of the types of test units being used satisfy the need. The warranty problem is a major issue in the lead-acid battery field which has simply not been solved.

Indeed, the situation is perhaps exacerbated by the increasing role mass merchandisers play in selling SLI and other lead-acid batteries. More particularly, the personnel responsible for dealing with battery returns not only do not have discriminating test units at their disposal, but are often less than adequately trained to deal with the many issues underlying whether a battery being returned is bad or good.

Still further, in many situations, the lack of patience of the customer can be evident. A decision as to whether the battery is good or bad needs to be capable of being provided in a relatively short period of time. Additionally, if the battery is determined to be good but in a discharged condition, then the customer will want to have the battery recharged in as short a time as possible.

Given the many and varied parameters that need to be addressed to allow a highly discriminating diagnostic testing regiment to take place and to rapidly recharge acceptable batteries, providing a suitable diagnostic test unit which can be safely used by the responsible personnel is a formidable task. Accordingly, it is a primary object of the present invention to provide a method and apparatus capable of rapidly discriminating between good and bad lead-acid batteries. A more specific object of this invention provides a test regiment capable of carrying out the appropriate determination in no more than 15, and still more preferably less than 10, minutes.

Another object lies in the provision of a diagnostic test unit capable of testing various types of lead-acid batteries having a variety of capacities as well as conditions while appropriately discriminating between good and bad batteries.

Still another object of the present invention provides a diagnostic test unit which can be operated by personnel with limited training at most.

Yet another object of the present invention provides a diagnostic test unit characterized by safety features which minimize, if not eliminate, safety issues as regards both users and as to the test units themselves.

A more specific object of this invention lies in the provision of a diagnostic test unit which includes an interactive charging unit capable of rapidly and reliably recharging lead-acid batteries.

Other objects and advantages will become apparent from the following detailed description.

SUMMARY OF THE INVENTION

In general, the present invention provides a straightforward diagnostic test unit and system which automatically and rapidly takes advantage of the known phenomenon that battery resistance can be characterized by discharging at various rates and measuring the resulting voltage. Thus, as is known, the current versus voltage relationship is linear and the proportionality constant is the resistance (or inversely the conductance) of the battery in a discharging mode. This can also provide a derived voltage at vanishing current which represents the polarized potential of the battery. According to the present invention, the diagnostic test unit utilizes a charger combined with a rapidly variable load. Each is controlled by signals to and from a microprocessor; and, additionally, an input display provides directions to, and derives information from, the system operator. After inputting the battery type (12V or 6V), the cold cranking rating ("CCA") or cranking rating ("CA"), and providing the temperature of the battery, a diagnostic ramp procedure is utilized to provide an instantaneous current versus voltage analysis to determine the instantaneous CCA (i.e., the single crank capability at full charge) of the battery being tested. If the instantaneous CCA of the battery being tested is above a level determined acceptable, a sustained discharge is carried out to tax the capacity of the battery.

The amount of time held at this sustained discharge rate is proportional to the determined instantaneous CCA of the battery and the temperature. Small batteries with low CCA rates are discharged a shorter time than large CCA batteries while cold batteries are discharged for a shorter period of time than are hot batteries.

At the end of the constant current discharge, the current is again ramped from a high level to a lower level to determine a loaded or polarized CCA which simulates the battery power after multiple cranking attempts. If the loaded CCA (i.e., the single crank capability at the present state of charge of the battery) is below a desired percentage of the rated capacity, then the battery is put into charge. It has been found that a battery does not have to be charged very much to respond acceptably to these ramping probes. Indeed, if a battery cannot be acceptably charged within the time of a given number of diagnostic probes, the battery is deemed to be a bad battery.

In accordance with the preferred embodiment of the present invention, the charging steps utilized during the diagnostic testing, as well as any charging of batteries determined to be good, utilizes a novel interactive stepping procedure which allows batteries determined to be good to be recharged in a minimum period of time without overheating the battery or spewing electrolyte.

Additional features and advantages of the invention will be made apparent from the following detailed description of illustrative embodiments which proceeds with reference to the accompanying figures.

BRIEF DESCRIPTION OF THE DRAWINGS

While the appended claims set forth the features of the present invention with particularity, the invention, together with its objects and advantages, may be best understood from the following detailed description taken in conjunction with the accompanying drawings of which:

FIG. 1 is a block diagram of a battery diagnostic tester and charging system embodying the present invention;

FIG. 2 is a block diagram of a system controller for performing diagnostic tests and charging a battery according to the invention;

FIG. 3 is a block diagram of DC sensors for sensing voltage and current across the battery terminals according to the invention;

FIG. 4 is a block diagram of a variable programmable DC power supply/load for charging and discharging batteries according to the invention;

FIG. 5 is a logic flow diagram illustrating the steps involved in performing the diagnostic battery test and battery charge procedures according to the present invention;

FIG. 6 is a logic flow diagram illustrating the steps involved in starting up the diagnostic tester and charging system;

FIGS. 7A and 7B are logic flow diagrams illustrating the steps involved in performing the diagnostic procedure;

FIG. 8 is a logic flow diagram illustrating the steps involved in performing the diagnostic ramp procedure;

FIGS. 9A and 9B are logic flow diagrams illustrating the steps involved in performing the charge start procedure;

FIG. 10 is a logic flow diagram illustrating the steps involved in performing the charge control procedure;

FIG. 11 is a logic flow diagram illustrating the steps involved in charging the battery according to the interactive stepping procedure;

FIG. 12 is a logic flow diagram illustrating the steps involved in running the current stability reset procedure;

FIGS. 13A and 13B are logic flow diagrams illustrating the steps involved in the check procedure;

FIGS. 14A and 14B are logic flow diagrams illustrating the steps involved in conditioning or destratifying the cells of a battery;

FIG. 15 is a logic flow diagram illustrating the steps involved in monitoring the current stability during the charging procedure;

FIG. 17 is a logic flow diagram illustrating the steps involved once a battery is deemed untestable;

FIG. 18 is a logic flow diagram illustrating the steps involved in shutting down the charger/discharger if stopped by the operator or if the conducting cables are removed;

FIG. 19 is a logic flow diagram illustrating the steps involved in shutting off the charger/discharger if the battery tested is a failure;

FIG. 20 is a logic flow diagram illustrating the steps involved in shutting off the charger/discharger if a fault occurs;

FIGS. 21A and 21B are probing profiles that illustrate the stepped output voltage settings over time in conformance with the interactive stepping procedure; and FIG. 22 is a graphical representation of the diagnostic tester and charger unit according to the present invention.

DETAILED DESCRIPTION OF THE PREFERRED EMBODIMENTS

Figure 16:
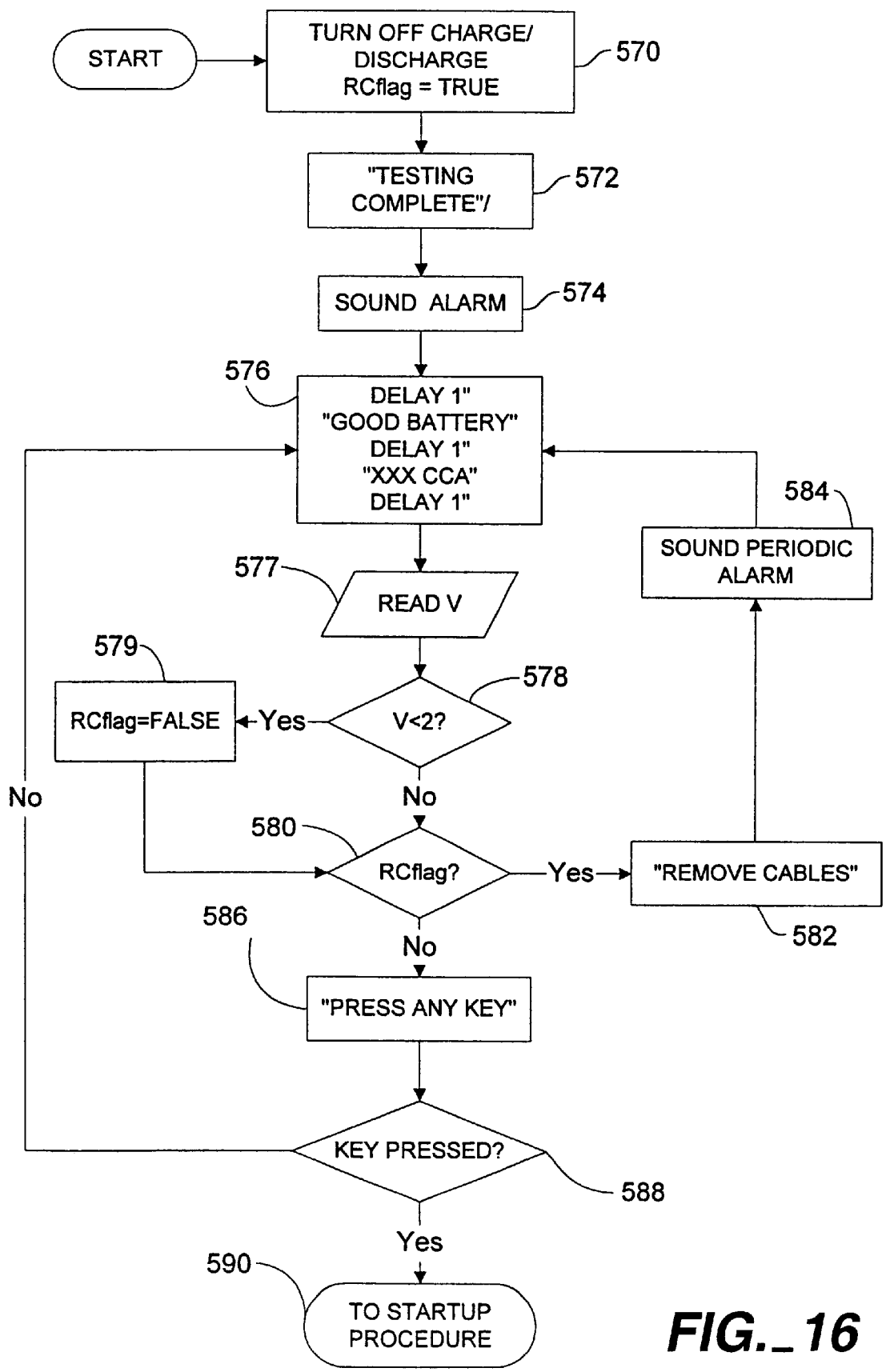
FIG. 16 is a logic flow diagram illustrating the steps involved in stopping the charger/discharger once a "good" battery is tested and charged.

The present invention is directed to a battery diagnostic testing system and method that tests batteries under both charge and discharge conditions yielding discriminating data relating to the condition and usability of the batteries. The invention is further directed to a battery charging system and method that rapidly recharges batteries based on an interactive charging procedure. While this invention is primarily described with respect to the diagnostic testing and charging of lead-acid batteries, there is no intention to limit the invention to any particular type of battery. Rather, the invention is specifically intended to be used with all types of batteries capable of accepting an external charge, including, but not limited to, all types of lead-acid batteries, nickel-cadmium batteries and other rechargeable battery types.

Turning to the drawings and referring first to FIG. 1, a diagnostic tester and charging system 10 according to the invention comprises a system controller 12, a variable programmable DC power supply and load 14, DC sensors 24, conducting cables 18 and a battery 16. The system controller 12 is coupled to the power supply 14 and includes control circuitry for regulating the output of the power supply 14. The power supply and load 14 are coupled in a conventional manner to a battery 16 using conducting cables 18 which link the power supply and load 14 to the charging terminals 20, 22 of the battery 16. Depending on the amount of charge to be conveyed, the conducting cables 18 may comprise heavy-gauge copper wires or cabling compliant with National Electrical Code requirements. The DC sensors, which sense current and voltage across the battery terminals 20, 22, return the values thereof to the system controller 12 to which they are coupled.

As shown in FIG. 2, the system controller 12 comprises a microprocessor 26, a memory 28, and input/output (I/O) circuitry 30 connected in a conventional manner. The memory 28 is comprised of random access memory (RAM), read-only memory (ROM) and the like. The I/O circuitry 30 is coupled to an operator input 32 that comprises the means to input relevant operator commands and data, such as the rated CCA (Cold Cranking Amps) of the battery. The I/O circuitry 30 is also coupled to a display 34 that comprises the means to display relevant output messages, such as messages informing the operator on the status of diagnostic testing or charging, or messages prompting the operator to enter commands or data. The I/O circuitry 30 is further coupled to the power supply and load 14 and comprises the means to send commands originating in the microprocessor 26 to the power supply and load 14 and to send messages originating in the power supply and load 14 to the microprocessor 26. Similarly, the I/O circuitry 30, which is coupled to the DC sensors 24 through the use of sensing leads, comprises the means to receive sensor data.

The preferred system controller 12 includes analog-to-digital converters 38 therein for converting the current and voltage measurements supplied by the DC sensors 24 to digital values capable of being manipulated by the microprocessor 26. The system controller 12 also includes a digital-to-analog converter 40 therein for converting a digital control signal to the proper analog signal required by the power supply and load 14. In the preferred embodiment, pulse width modulators (PWMs) are used in place of digital-to-analog converters 40 to generate the command signal. Moreover, in the preferred embodiment, the analog-to-digital converters 38 and pulse width modulators 40 are contained within, or on board, the microprocessor 26 along with RAM and ROM 28. Alternatively, the analog-to-digital converters and pulse width modulators can be separate devices contained within either the input/output circuitry 30 (as shown) or the DC sensors 24.

One integrated circuit, a Microchip PIC17C756 microcontroller, has been identified as being particularly useful as a component within the system controller 12, as it provides a microprocessor, RAM, ROM, analog-to-digital converters and timer/counter capabilities in a single chip. The PIC17C756 analog-to-digital converters allow conversion of an analog input signal, here voltage, to a corresponding 10-bit digital number through the use of analog voltage comparators. The PIC17C756 also allows transmission of signals enabled through the use of on-board pulse width modulators.

As represented in FIG. 3, the exemplary diagnostic tester and charger is comprised of four DC sensors: a charging current sensor 42, a discharging current sensor 44, a voltage sensor 46, and a reverse polarity sensor 48. As illustrated, the voltage sensor 46 is connected in a conventional manner to measure the voltage across the terminals 20, 22 of the battery 16. The voltage across the battery terminals is read and attenuated by a voltage attenuator in order to match the input range of the analog-to-digital converters 38 residing in the system controller 12. The voltage sensor 46 is selected so as to be sensitive enough to reflect critical voltage changes with 0.01V accuracy.

The reverse polarity sensor 48, connected in a like manner across the battery terminals 20, 22, senses negative voltage indicating that the battery leads are connected backwards. The reverse polarity sensor 48 is similarly connected to a voltage attenuator which scales the voltage reading to match the input range of the analog-to-digital converters 38.

The charging current sensor 42 and discharging current sensor 44 are connected to measure the current across a shunt resistor 50. Due to differences in current magnitude and sensitivity, two current sensors may be required to measure the charge and discharge currents. The charging current sensor 42, used to measure current flow into the battery 16, is selected so as to be sensitive and accurate enough to measure changes in the charging current at the various steps of the charging procedure. (See FIG. 11). According to the invention, the charging current sensor 42 should be capable of sensing current in the range between 0 and 80 A.

The discharging sensor 44, used to measure current flow out of the battery 16, is selected so as to be sensitive enough to measure a wide range of current during the diagnostic discharge routine. (See FIGS. 7A and 7B). According to the invention, the discharge current sensor 44 measures current flow between 0 and 400 A. In addition, the charging and discharging current sensors are connected to a current amplifier which scales the current reading to match the input range of the analog-to-digital converters.

As shown in FIG. 4, the variable programmable DC power supply and load 14 includes a DC power supply 52 and a variable load 54. According to the invention, the power supply 14 is capable of providing an electrical charge output at either a variable voltage level or a variable current level (or both). The amount of current and/or voltage supplied by the power supply 14 is determined by the system controller 12 which sends commands to the power supply 14. The power supply 14, therefore, includes the means to interpret the commands which can be either in the form of digital signals or analog signals. In the preferred embodiment, pulse width modulators 50 are provided within the system controller 12 so that the power supply only requires the means to interpret analog commands.

To discharge current from the battery 16, a variable load 54 is programmed to provide a variable or constant (sustained) load between 0 to 400A. Programmable load variance is used to determine battery performance during diagnostic testing. The preferred variable load 54 is comprised of a series of field effect transistors (FETs) connected to heat sinks. Alternatively, a series of straight resistors can be used to vary the load or one large resistor can be used while simultaneously charging and discharging to effectively vary the resistance or any combinations thereof. Like the power supply 14, the variable load 54 includes the means to interpret commands sent by the system controller 12.

During the diagnostic test or charge, the system controller 12 may control means 56 such as a relay, a switch or the like to automatically connect the battery 16 to the circuit. For example, the switch 56 is open while measuring the open circuit voltage of the system. Conversely, the switch 56 is closed allowing current to flow across a shunt resistor 50 to enable charging, discharging and current measurements to be taken.

It can be readily appreciated that any number of equivalent system controllers and DC power supplies/loads can be developed from other digital and analog circuitry components to perform the desired control functions as described in more detail below. For example, a diagnostic tester and charger apparatus has been implemented comprising an IBM 486SX33MHz personal computer as the system controller 12 executing instructions originally written in the BASIC programming language (here Quick Basic Version 4.5), to control a switch mode power supply and load 14 via a data acquisition/control board interface bus. A diagnostic tester and charger apparatus has also been implemented comprising a system with an on-board microprocessor for measuring and adjusting the components for charging and discharging but takes commands from a higher level processor on-board a PC computer via an RS232 interface bus.

While not necessary to the invention, it can also be readily appreciated that it is preferable to employ dedicated circuitry as the system controller 12 and power supply and load 14 for use in commercial applications such as in vehicle-based battery testing and charging systems or stand-alone battery testing and charging devices.

According to the invention, the system controller 12 executes a software routine that performs diagnostic tests on a lead-acid battery to determine whether the battery is "good" (e.g., capable of accepting a charge and delivering acceptable power). Upon determining that the battery is good, the battery is charged to an appropriate level in a timely manner and may be conditioned to destratify the electrolyte and equalize the cells and electrodes. FIGS. 5–20 illustrate the steps involved in performing the diagnostic battery test and charge method according to the present invention.

FIG. 5 illustrates the overall procedure used to implement the current invention. The exemplary testing/charging procedure begins in step 100 by connecting, in a conventional manner, the lead-acid battery to the diagnostic unit as illustrated in FIGS. 1–4. In step 102, the start up procedure is invoked wherein proper connection of the battery to the diagnostic unit is verified, critical data is input by the operator via appropriate buttons and keys, and the voltage is measured. At step 104, a preliminary determination is made as to whether the battery is untestable by measuring a very low voltage after the start key is pressed. An untestable battery causes the procedure to stop at step 106 and return to start at step 100. A testable battery proceeds to the diagnostic procedure at step 108 wherein the cold cranking amps, CCA, of the battery is measured through the use of current discharge. After the diagnostic procedure which is preceded by several charging attempts, the battery being tested may be deemed "bad," in which case at step 110 a decision is made to proceed to step 112 and end diagnostic testing and charging on the battery. A "bad" battery is generally described as one which is either defective or appears to lack adequate cranking after one or more charging attempts.

If the battery is not judged "bad," however, at step 114 the charger will be turned on and the battery will be charged and checked in accordance with the rapid interactive stepping procedure at step 116. During the charging process, in steps 118 through 130, a status determination is repeatedly made as to the battery's viability. At step 118, if the battery is judged "good and charged" to an acceptable level, the method proceeds to step 120 wherein the battery is either conditioned to destratify the electrolyte or the charge procedure is stopped. Alternatively, at step 122, if the battery is judged "bad," the method proceeds to the fail shutoff procedure at step 124 and the charger/discharger is turned off. If, however, the operator pressed stop or the cables were removed during the charge procedure as determined in step 126, the method proceeds in step 128 to the shutdown procedure. If none of the above conditions is fulfilled, meaning the battery has not tested good and is not adequately charged, the system proceeds to step 130 where the system will either continue to charge the battery in step 116 or retest the battery in step 108. In all, the system will attempt to charge and test the battery a limited set number of times before designating the battery as bad and incapable of delivering adequate power.

FIGS. 6 through 20 illustrate in more detail the various steps outlined generally in FIG. 5. The start up procedure, illustrated in FIG. 6, begins at step 134 by resetting and calibrating the diagnostic tester unit. During this step, all critical variables are initialized as required by the method. For example, a variable AH, used to indicate the capacity of a battery in ampere-hours, is zeroed. The reset step is implemented at the beginning of each diagnostic testing/charging routine for each battery regardless of whether the diagnostic unit is turned off between batteries. Upon completion of the reset and calibration step, at step 136 a tester identification message is posted briefly on the display and a small delay of two seconds is implemented to allow the system to stabilize. After the short delay, at step 138 the diagnostic tester measures the battery open circuit voltage (OCV) with a switch 56 such that the voltage sensor 46 and reverse polarity sensor 48 read the voltage across the battery terminals 20, 22 without any load or charge.

In all, steps 138 through 150 determine whether the battery to be tested is properly connected to the diagnostic unit. For example, at step 140, the diagnostic unit determines if the operator has pressed the start button. If the start button has been pressed, at step 142, the OCV is compared to an extremely low voltage to determine whether the battery is testable. If the battery's OCV is less than 0.3V, the method proceeds at step 143 to run the untestable procedure which notifies the operator that the battery is untestable. (See FIG. 17). If the start button has not been pressed, at step 144, the OCV is compared to a low negative voltage to determine whether the conducting cables 18 are properly connected to the battery 16. If the OCV is less than –0.5V, the method proceeds at step 146 to notify the operator that the leads are reversed. If the OCV is greater than –0.5V, at step 148, the OCV is compared to an extremely low voltage to determine whether a battery is connected. If the OCV is less than 0.3V, indicating that a battery is not connected, the method proceeds at step 150 to display a message instructing the operator to connect the cables.

If the OCV is greater than 0.3V, indicating a properly connected battery, the method proceeds at step 151 to determine the type of battery that has been connected. If the OCV is less than 7.2V, at step 152, the operator is prompted to enter the battery type. At step 153, the operator inputs the battery type, either 12V or 6V, depending on the type connected to unit for testing. At step 154, the operator is next prompted to enter the rating mode of the battery. As is known in the art, batteries are rated by the CCA (Cold Cranking Amps) or CA (Cranking Amps) of the battery, where CA is equal to approximately 1.2 times the CCA. The CCA of a battery is the number of amperes a lead-acid battery at 0 degrees F. (−17.8 degrees C.) can deliver for 30 seconds while maintaining at least 1.2 volts per cell (7.2 volts for a 12 volt battery). A typical car battery will have a CCA in the range of 350A to 900A. The CA of a battery is the number of amperes a lead-acid battery at 32 degrees F. (0 degrees C.) can deliver for 30 seconds and maintain at least 1.2 volts per cell (7.2 volts for a 12 volt battery). The operator inputs the rating mode at step 155. The operator is next prompted, at step 156, to input the battery's rated CCA or CA and at step 157, the rated CCA or CA is input into the system. If the operator does not alter the default value of the battery rating, the CCArated variable is set to the previously tested value or the default value of 550A. In the case of a CA (cranking amps) rated battery, the default value is 650 A.

Next, at step 158, the method prompts the operator to input the battery's temperature. As is known in the art, the temperature of the battery is a major factor affecting the battery's cranking power. According to the invention, a temperature probe is used to accurately measure the battery's temperature before the diagnostic test. The exemplary diagnostic unit is equipped with an automatic temperature probe, such as an infrared temperature sensor or a thermocouple in contact with the battery. In the preferred embodiment, the temperature sensor is in the form of a temperature gun pointed at the battery by the operator. In another preferred embodiment, the temperature sensor is an infrared sensor mounted in the diagnostic unit safety chamber having safety glass, as shown in FIG. 22, and may include a proximity sensor for sensing the presence of the battery in the chamber. Alternatively, a manual device for measuring temperature such as a thermometer or thermal sensor strip affixed to the battery can be used. At step 159, the battery temperature is input into the system. If the operator does not alter the battery temperature, the default value is set to 80° F. or the previous temperature value.

Once critical battery information is input into the system, at step 160 the operator is prompted to press start. The method then waits at step 162 until start is pressed where upon the method proceeds to probe the battery for a preliminary impression of chargeability. At step 164, the voltage and current output in the power supply are set to appropriate levels in order to create an inrush current. Thereafter, commands are sent to close the solenoid switch 56 to allow current flow into the battery, to turn the charger on, and to set the start the system timer.

In steps 166 to 170, the start up routine loops until the inrush current exceeds a nominal value, e.g., 4A, at which point the diagnostic procedure is invoked at step 170 (see FIGS. 7A and 7B). If, after an adequate time, e.g., fifteen seconds, the inrush current fails to exceed a low minimum threshold, around 0.5A in the preferred embodiment, the battery is deemed bad for failure to accept a charge and the start up routine proceeds to the fail procedure at step 176. (See FIG. 19).

As illustrated in FIG. 7A, the exemplary diagnostic procedure begins in step 180 by informing the operator via the display 34 that testing has begun. In step 182, the method initializes the unit in preparation for discharge testing. More specifically, the charger is turned off, a temperature factor used to accurately gauge the battery's CCA is calculated, and all cranking variables critical to the procedure are set or reset. For example, the instantaneous CCA, CCAinst, which represents an estimate of the cold cranking power at full charge, is set to zero. In addition, the probe number counter is incremented to reflect the number of diagnostic attempts made at periodic intervals, e.g., five minutes, to test the battery. In the preferred embodiment, only a limited number of attempts, preferably four or less, are made to test any particular battery before the battery is deemed bad (see FIG. 9A, step 266). As a result, with the preferred five minute intervals of charge, diagnosis of the battery as "good" should occur within fifteen minutes or the battery is deemed "bad."

After the probe number counter is incremented, the discharger is turned on. Thereafter, in steps 184 through 196, the adjustable load is gradually increased from zero current in incremental amounts which effectively increases the discharge current flow from the battery. In the preferred embodiment, at step 184, the discharge current is increased by 20A during each pass until the load reaches 200A. After each increase in load, at step 186, the resultant voltage and current are measured and the ampere-hours, AH, calculation is updated. In step 188, the current output measured is compared to a minimum threshold value. In the preferred embodiment, if the current output falls below 5A, the method proceeds at step 190 to the shutdown procedure. (See FIG. 18). Similarly, in step 192, the voltage output measured is compared to a minimum threshold value. In the preferred embodiment, if the voltage drops below a minimum of 7.2V, the discharge procedure is immediately stopped at step 238 (FIG. 7B). Sustaining a high rate of discharge at low voltages yields little information regarding the condition of the battery and may lead to dangerous conditions. Before proceeding to the charge routine, at step 194 the instantaneous CCA, CCAinst, is calculated and at step 208 the CCA is set to zero. If voltage output measures above a minimum threshold value, at step 196, the current discharge, Idischarge, is compared to a threshold discharge current. Once the threshold discharge current, set at 100A in the preferred embodiment, is reached, the diagnostic ramp procedure is invoked at step 198. (See FIG. 8).

The diagnostic ramp procedure, as illustrated in FIG. 8, begins at step 244 by setting/resetting the ramping variables and setting the initial discharge current, Idischarge, to a level of 100A. Then in steps 245 to 251, the discharge current level is incrementally increased to reach a safe upper ramp current. According to the invention, the battery should be taxed at a reasonably high current value in order to produce meaningful values of battery resistance. In the preferred embodiment, the maximum discharge current should be near 400A if the discharge voltage is above a minimum level. During steps 245 to 251, the current discharge decrement, Y, is also determined so that the discharge ramp procedure cycles through a sufficient number of discharge steps in order to produce an adequate number of data points for performing regression testing.

At step 252, the discharge current and voltage are measured across the battery terminals and the ampere-hours, AH, calculation is updated. As the discharge process loops from step 252 to 262, the current is rapidly decreased while the-resultant current and voltage are measured at each level until the load reaches a base level. According to the invention, the base level is equal to the high current value, A1, minus four times the current discharge decrement, Y. In the preferred embodiment, the base level is near 200A. At step 253, if the current drops below a minimum value, the method proceeds at step 254 to the shutdown procedure. (See FIG. 18). In the preferred embodiment, a current reading below a minimum value of 5A indicates cable removal or a connection interrupt.

Given an adequate current, however, at step 255 the current and voltage measurements taken at step 252 are stored in variable arrays and a counter, N, is incremented to track the number of iterative measurements. During the discharge procedure, the voltage and current are examined to verify that the battery has adequate power. Low battery power yields only meaningless battery measurements which are not helpful in determining the battery's state as either good or bad. Therefore, at step 256, if the voltage level drops below a minimum acceptable level the discharge procedure is stopped. In the preferred embodiment, a load voltage across the battery below 2V suspends the discharge routine until the battery is charged. If the discharge routine is suspended, a low value estimate of the CCA of the battery is calculated at step 258 and the process returns to the diagnostic procedure at step 268. Overall, the entire ramping discharge process generally lasts only a fraction of a second and removes only a minimum amount of capacity from the battery.

Once the rapid discharge is complete and a base level is reached as indicated in step 262, the voltage and current data measured is used to calculate regression parameters in step 264. For example, SA and SV represent the sum of all current and voltage measurements, respectively. Similarly, SA2 and SV2 represent the sum of all current and voltage measurements squared, respectively. Then, in step 266, the method uses the regression parameters to determine the linear relation between voltage and current wherein M represents the slope of the line in terms of negative ohms, R is the resistance in milliohms, and VACT is a resistance activation voltage. The resistance activation voltage is easily determined to be the voltage at zero current predicted from the straight current versus voltage line. A low VACT potentially indicates a short in the battery or the battery is very discharged, whereas a high VACT means the battery is reasonably charged.

After completion of the first discharge routine, the diagnostic ramp procedure is exited at step 268 and the overall diagnostic procedure resumes processing at step 200 as illustrated in FIG. 7A. At step 200, the system determines whether a CCA has already been calculated by comparing the CCA to zero. If a CCA has already been calculated, as in step 258 for the reason that the voltage dropped below a minimum set level, the process follows a separate path ultimately charging the battery. Specifically, in step 202 the instantaneous CCA is set to the previously calculated CCA and the CCA is then set to zero in step 208. The system then proceeds, as shown in FIG. 7B, to turn off the discharge unit in step 238 prior to attempting diagnostic testing again.

If the CCA is zero in step 200, indicating that the diagnostic ramp properly finished, at step 204 the system calculates the instantaneous CCA, CCAinst, based on previously calculated parameters. According to the invention, CCAinst=(((0.00618*Battery Temperature+11.6)−(7.9+0.0043*Battery Temperature))* 1000/R)/Temperature Factor, where R is the resistance calculated during the diagnostic ramp procedure in step 198 and Temperature Factor is a value from 1 to 3 stored in a lookup table. If the calculated instantaneous CCA is below a fraction, k, of the rated CCA, as in step 206, no further discharge occurs. The method thereafter proceeds at step 208 to reset CCA to zero and then at step 238 to turn off the discharge unit. The battery will thereafter be charged in an attempt increase its power. In the preferred embodiment, the tested battery should perform at or above sixty-five percent of the rated CCA in order to continue diagnostic testing. If the instantaneous CCA is above the set level in step 206, a sustained discharge to tax the capacity of the battery is performed for a period proportional to the determined instantaneous CCA of the battery at its present temperature. As such, batteries with a low CCA will be discharged for a shorter period of time than those with a larger CCA. Similarly, cold batteries will be discharged for a shorter period of time than hot batteries.

In the preferred embodiment, the constant current discharge is set to 200A, or half of the CCAinst if CCAinst is less than 400A, and the timer is started at step 210 in FIG. 7B. The procedure then loops through steps 212 to 222, reading the resultant current, voltage and updating the ampere-hours, AH, at step 212. In steps 214 and 218, the voltage and current are compared to minimum threshold values during the constant current discharge period. A current drop below 5A indicates a connection interrupt and the method proceeds to the shutdown procedure in step 216. (See FIG. 18). Similarly, if the voltage drops below 7.2V, the discharge routine is stopped and the battery proceeds to turn off the discharge unit at step 238 after setting the CCA to zero at step 200.

At the end of the constant current discharge as determined in step 222, the cranking variables are reset at step 224 and the diagnostic ramp procedure is invoked for the second time at step 226. As described previously and illustrated in FIG. 8, the current is ramped from a high level to a lower level while recording the current and voltage readings at each level. Upon returning from the diagnostic ramp procedure, at step 228, a determination is made as to whether the CCA was calculated. If the CCA is not equal to zero, indicating the battery failed to complete the full ramp, a temperature adjustment is made at step 230 and the discharge unit is turned off at step 238.

If the CCA is equal to zero, the second ramp data is then used to determine a loaded or polarized CCA, at step 232, which represents the battery's actual power after multiple cranking attempts. According to the invention, CCA= ((VACT−(7.9+0.0043*Battery Temperature))*1000/R)/ Temperature Factor, where VACT is the activation voltage, R is the resistance calculated in step 266 of FIG. 8, and Temperature Factor is a value from 1 to 3 stored in a lookup table. In addition, 7.9 represents an adjustment factor required to predict cold cranking at 7.2V and 0.0043 represents the resultant change in voltage from a change in temperature. In addition to calculating the CCA in step 232, the activation voltage, Vact1, is set to the resistance activation voltage, VACT. At step 234, if the loaded or polarized CCA is below a fraction, k, of the rated CCA, the discharge unit is turned off at step 238. If, however, the loaded CCA is above a fraction of the rated CCA, the battery power is deemed acceptable or "good" at step 236. In the preferred embodiment, the tested battery should perform at or above sixty-five percent of the rated CCA in order to be deemed acceptable. Thereafter, the discharge unit is turned off at step 238 and the battery proceeds to the charge routine in step 240.

The battery charging process begins with the charge start procedure illustrated in FIGS. 9A and 9B. Overall, the charge start procedure initializes the system and prepares the battery to receive a charge. During the charging process precautions are taken to ensure the battery is capable of accepting a charge as well as setting the charging values according to the specifics of the battery.

The charge start procedure begins at step 272 by performing an initial reading of the battery's current and voltage across the battery terminals 20, 22 and starting a timer. Next, the system loops through steps 274 to 278 until the voltage across the terminals stabilizes or a set time elapses as indicated by the timer. In the preferred embodiment, at step 274, the most recent voltage reading is stored as Vk and new current and voltage readings are measured at step 276 after a short delay, around 1 second. Then, at step 278 a comparison of the two most recent voltage readings, V and Vk, is made and fluctuations within the accuracy range of the system, 0.01V, indicate the voltage is stabilized allowing the method to proceed to step 280. For fluctuations greater than 0.01V, an elapsed time greater than twenty seconds also causes the method to proceed to step 280.

At step 280, the open circuit voltage, Vopen, and shutoff voltage, Vshutoff, are set to the last voltage reading taken at step 276. If the open circuit voltage is extremely low, less than 0.3V, as determined in step 282, the method proceeds to the fail routine at step 284. At this point in the charging process, an extremely low open circuit voltage indicates the battery has an extremely high resistance and is incapable of being charged or discharged, thus, requiring shut down of the charge process. If an adequate open circuit voltage is measured, however, at step 286, the method determines whether the battery previously tested "good" during the diagnostic routine. If the battery did not previously test good, at step 288, the method checks the probe number to identify the number of times the charging routine has previously been initiated. If the probe counter is equal to one, indicating that the charging routine has not previously been initiated, the process cautiously continues with the charge start procedure at step 302. If, however, the probe counter is greater than one, indicating that the charging process was previously run, six separate inquiries are made in series in steps 290 to 300, to determine if the charging process should continue or proceed in step 301 to the fail routine as a result of a bad battery.

For example, in step 290, the method proceeds to the fail routine if the probe counter reveals that charging has been attempted more than a set number of times. In the preferred embodiment, the system is limited to no more than four attempts at probing and three attempts at charging, lasting up to fifteen minutes. In step 292, the previous charging current, PREVAMP, is compared to an adequate charging current. If the previous charging current is too low, less than 15A, indicating that the battery is not charging at an acceptable rate, the method proceeds to the fail routine. In steps 294 to 298, other criteria are used to determine if the battery should continue charging. If the battery fails any of these tests, the system will either proceed in step 301 to the fail routine as a result of a bad battery or proceed to step 300. In step 300, a comparison of the calculated CCA and rated CCA is made so that with each probe the acceptable performance, f(probe), gradually changes thus taking into consideration numerous charging attempts when determining the state of the battery. If the battery does not pass the test in step 300, the method proceeds to the fail procedure in step 301.

Referring back to step 286, if the battery previously tested "good" during the diagnostic routine or passed the tests in step 290 to 300, then the method proceeds to step 302 wherein the charge timer is started. Thereafter, in step 304, illustrated in FIG. 9B, all critical charging variables are reset. For example, the first and second differential variables are reset to zero, all step current values are reset to zero, and the charger current setting is set to a nominal amount to allow the battery to accept an adequate charge.

At step 306, the charger voltage setting, Vset, is set to a voltage greater than the previously measured open circuit voltage. In the preferred embodiment, the charger voltage is set to 3.5V greater than the open circuit voltage if the battery was not previously determined to be good, and 2V greater than the open circuit voltage if the battery was previously determined to be good. Also, at step 306, the maximum charging current is set to the highest level acceptable, 70A in the preferred embodiment. However, at step 308, when the open circuit voltage is then compared to a value empirically determined to be low for typical batteries, if the open circuit voltage is below that value, less than 10.5V in the preferred embodiment, the system proceeds cautiously in the event the battery is shorted and at step 310 sets the charger voltage and maximum charging current to values less than optimal. Thereafter, the charging current is set to the maximum charging current and a charge setup timer is started at step 312.

In steps 314 through 320, a minimal delay is used to allow the voltage and current to stabilize. At step 314, voltage and current measurements are taken and the battery's capacity in ampere-hours is updated. In step 316, a current reading below a minimum threshold value, around 0.3A, indicates a connection interrupt and the method proceeds to the shutdown procedure at step 318. Otherwise, after a delay of thirty seconds at step 320, the method proceeds to step 322.

In step 322, the charger voltage setting, Vset, is adjusted based on the stabilized voltage and current readings taken at step 314, the cable resistance and an anticipated rise in voltage. In addition, the charger current setting, Iset, is increased by 5A to allow latitude for current excursions in the stepping procedure. (See FIG. 11). Once the charger voltage and current are properly set, the system proceeds to the charge control procedure at step 324.

Overall, the charge control procedure, illustrated in FIG. 10, monitors and controls the interactive charging of the battery such that the charge process is maintained within certain effective and safe parameters. According to the invention, the procedure loops from step 328 to 362 until either it is stopped by conditions placed in the loop which dictate the disposition of the battery, or the charge time exceeds the maximum charge time allowed, or the capacity of the battery measured in ampere-hours exceeds the maximum charging ampere-hours allowed.

Beginning with step 328, the average charging current is saved as PREVAMP for future comparisons. Next, in step 330 the current, voltage and time are read followed by an update of the average charging current and battery capacity, AH, in step 332. Also, in step 332, the maximum charging current is determined and an estimate of the remaining charge time is calculated. Step 334 is a precautionary step which looks for a sudden drop or low value in current, as in the case of removed cables or a faulty connection. In that situation, the potential for unsafe conditions due to arcing is high and therefore, the method proceeds in step 335 to the shutdown procedure in which the charger is immediately shut off. If the current is adequate, in step 336 the average charging current, Aave, is compared to the maximum measured charging current MAXA. If the average charging current is greater than the previously measured maximum charging current, then at step 337 the maximum measured charging current is reset.

In steps 338 to 348, the charge control procedure determines the condition of the battery during the charging process. More particularly, in step 338, if the battery is deemed good and charged, the method informs the operator via the display 34 that the battery is good and it is acceptable to press stop in step 340. In step 342, if the battery is deemed good, but not adequately charged, the method informs the operator in step 344 that the battery is good and to wait for a complete charge. In step 346, if the battery is neither deemed good nor charged, the method informs the operator in step 348 that the battery is charging and to wait for a diagnostic retest to determine the status of the battery.

In step 350, a comparison of the voltage measured at step 330 to the maximum allowable charging voltage, Vmax, is made. If the voltage is too high, the charger voltage setting is reduced minimally in step 356 followed by a short time delay. Repeated small decrements of the charging voltage will result in a drop in the current after a brief period of time. The method then bypasses the stepping procedure at step 358 and proceeds to the check procedure at step 360. (See FIGS. 13A and 13B). If the voltage in step 350 is not too high, then in step 352, a comparison of the average current as calculated in step 332 to the sum of the maximum charging current allowable and the absolute differential current of the first charging step, explained below, is made. If the average current is greater than the sum, the method proceeds in step 354 to the current stability reset procedure. As illustrated in FIG. 12, the current stability reset procedure operates to reset various current stability factors when maximum current is achieved so that a determination of current stability is bypassed. Beginning at step 434, the method first assures that the voltage is not falling at maximum current. If the voltage is falling, the method proceeds at step 440 to return to the calling procedure. If the voltage is rising, at step 436 the stability factors are reset to zero. At step 438, the shutoff voltage comparator is saved for future use and at step 440, the method returns to the calling procedure. After completion of the current stability reset procedure, the charger voltage setting is reduced with a small time delay at step 356, the stepping procedure is bypassed and the check procedure is invoked at step 360. (See FIGS. 13A and 13B).

Referring back to step 352, if the average current is less than the sum of the maximum charging current allowable and the differential current of the first charging step, the method proceeds to the stepping procedure at step 358. According to the invention, once a battery is deemed acceptable for charging, the system proceeds in a step-wise manner to charge the battery as illustrated in FIG. 11. Overall, charging the battery is accomplished by first charging the battery at a voltage dependent on the base charging level, and then adjusting the base charging voltage level in a direction that provides a more optimal charge acceptance. The goal of charger method is to provide the maximum charge while minimizing to the greatest extent possible gassing of the battery. An exemplary step routine for charging a battery is disclosed in U.S. Pat. No. 5,589,757 assigned to the same assignee as that of the present application. The '757 method for step-charging batteries disclosed may be used in combination with the apparatus and method disclosed in the present invention.

In addition, a novel interactive stepping routine, illustrated in FIGS. 11 and 21, may be used to adjust the charging output to the battery in a direction of a more optimal charge acceptance. Overall, the stepping procedure requires that the charging output to the battery be adjusted so that the steps form two pairs of charging levels, where A1 and A2 constitute one pair and A3 and A4 constitute a second pair. According to a primary aspect of the invention, three separate probing voltage steps are coupled with a relaxation period to allow for the four separate current measurements, A1, A2, A3, and A4.

As shown in FIG. 11, steps 368 to 396, and FIG. 21, a current A1 is measured after a short delay TD1. The voltage is then increased, step one, and after a short delay TD2, the second current A2 is measured. The voltage output is then held constant for a relaxation period, TD3, to allow the current to stabilize. Thereafter, the third current, A3, is measured and the voltage is increased for a second time, step two. Finally, after a short delay, TD4, the current measurement, A4, is read and the voltage level is reset to its original amount. According to the invention, step increases or decreases in voltage are chosen to gather information about the battery during the charging process. In the preferred embodiment, the step one and step two voltage changes are set to the same value, +/−0.0425V, and the reset voltage change is set to two times the step one/step two voltage change (i.e., +/−0.085V) for 12V batteries. For 6V batteries, the step one/step two voltage changes are preferably +/−0.02125V and the reset voltage change is +/−0.0425. In addition, time delays TD1, TD2, TD3, and TD4 are set to 250 ms, 150 ms, 300 ms, and 125 ms respectively.

Once the four probing currents are measured, in step 398, three differential calculations are made. First, a lower differential, DA1, using the first pair of charging levels, A2 and A1, is calculated where DA1 is equal to A2 minus A1. Similarly, an upper differential, DA2, is calculated where DA2 is equal to A4 minus A3. Lastly, a second differential, D2A, using the first differentials, DA1 and DA2, is calculated where D2A is equal to DA1 minus DA2. Overall, the second differential current, D2A, is used to adjust the charging voltage direction. The D2A differences in current are accumulated in a moving average so that spurious individual readings do not dominate the system. Furthermore, the average is made relative on a zero to one scale and multiplied by the voltage step increment to adjust the battery voltage. Ideally, the system adjusts the charging voltage until little or no voltage change is required to maintain an optimal charging level.

At step 400, the differential values are first evaluated to determine if the calculations yielded values within a normal range expected. If the values prove to be too large, the method skips ahead to step 414 using previously calculated differential values. If the values are within a normal range, steps 402 to 410 limit the range and direction of the stepping voltage adjustment referred to as the "stepfraction." In the preferred embodiment, changes in the current measured by the second differential are limited to increments of 0.1 or −0.1 so that only fractional corrections are made. The fractional corrections represent the rate of adjustment and the speed at which changes are made to the voltage in order to charge at an optimal rate. The determination to increment or decrement the voltage is made in steps 402 to 408. That is, second differential values greater than 0.1 result in a 0.1 step change at step 404. Second differential values less than −0.1 result in a −0.1 step change at step 408. As a result, second differential values greater than or equal to −0.1 and less than or equal to 0.1 result in no changes to the D2A value previously calculated.

Thereafter in step 410, a weighted average is calculated to smooth the step changes and the stepfraction is normalized between zero and one. A stepfraction or change in voltage of one means a high rate of change is required, whereas a stepfraction of zero represents a zero rate of adjustment indicating that the battery is being charged at an optimal rate. Prior to adjusting the charger voltage setting, a comparison of several charging currents is made in step 412 in order to determine if any further current adjustments are required to maintain current levels at a maximum without large fluctuation. Specifically, the absolute value of the difference between the average charging current and maximum charging current allowed is compared to the absolute value of the first differential, DA1. If the current is below the maximum level, at step 414 a determination is made whether to increment or decrement the charger voltage setting, Vset, by a factor of the stepfraction in steps 416 and 418. However, if the current is at or near the maximum, at step 420 the current stability reset procedure is invoked, as described above, to prevent shutdown at the maximum flat current. Then, at step 422 the stepfraction is interpolated so that a change in the charger voltage setting results in the maximum current for stability. At step 424, a determination is made whether the average charging current is greater than the maximum charging current. If greater, the charger voltage setting, Vset, is reduced in step 418 and if less, the voltage is increased in step 426. After a current and time reading, an AH update, and a final time delay, TD5, at step 428, the system returns to the charge control procedure at step 430. In the preferred embodiment, time delay TD5 is set to 200 ms.

Referring back to step 358 in FIG. 10, after completion of the stepping procedure the check procedure is invoked at step 360. Overall, the check procedure, illustrated in FIGS. 13A and 13B, is used to determine when a battery is charged or in need of a retest, or to identify defective batteries. The check procedure begins at step 444 by first determining whether to measure current stability. A check of the charging stability is made periodically in order to ensure an abnormal current rise is not occurring. In the preferred embodiment, a timer is used to enable a current stability check every two minutes.

If the timer does not indicate a stability check is necessary, the method proceeds at step 460 to determine if the average charging current, Aave, is below a rate sufficient to condition and charge the battery. If the average charging current is below the threshold level, a final check of the battery's status is evaluated in steps 450 through 458. At step 450, batteries which are "not good," that is, shorted or low powered, are identified. If the battery is non-responsive as indicated by various voltage readings so as to be considered not good, the system proceeds to the fail procedure in step 452. (See FIG. 19). If the battery is responsive and behaving normally, at step 454 a determination is made as to whether the battery requires conditioning. If the battery is sulfated or requires conditioning or destratification, the method proceeds to the conditioning procedure at step 456. (See FIGS. 14A and 14B). If conditioning is not required, the method proceeds at step 458 to the good/stop procedure. (See FIG. 16).

Referring back to step 460, if the average charging current is not sufficiently high, a check of the time is made at step 461 to verify a delay of 90 seconds. If the time delay is less than 90 seconds, the system proceeds to step 466 in FIG. 13B (see below). If a delay of 90 seconds has elapsed, at step 462 various voltage, current and timing variables are evaluated to determine if the battery is defective (e.g., either shorted or not charging adequately). If the battery is defective, at step 464 the fail procedure is invoked. Otherwise, at step 466 in FIG. 13B the method determines whether the battery has previously been deemed charged. That is, whether the flag which signals the battery is adequately charged has been set to true in which case the method returns at step 468 to the charge control procedure. If the flag has not been set to true, at step 470 the method evaluates the condition of the battery to determine if the battery is in fact adequately charged. If the battery meets the test as illustrated in step 470, the charged flag is set to true at step 472.

Next, at step 474 the checking procedure determines whether the battery has previously been deemed "good." If the battery is good as indicated by a flag, the checking procedure returns to the charge control procedure in step 468. If the battery has not yet been deemed good, the checking procedure at step 476 determines for the second time whether the battery is charged. This condition will arise only if the battery met the test of step 470 and the charged flag was set to true in step 472. In that case, at step 482 the checking procedure determines if any significant charge has been applied to the battery so as to justify a retest. In the preferred embodiment, if the amount of charge since the end of the last charge period is extremely low, less than 0.5 AH, the system proceeds to the fail routine at step 484. However, if the charge increase is above the minimum threshold, the system proceeds to the diagnostic procedure for a retest in step 486. After the diagnostic procedure, another determination is made as to whether the charged battery is "good." At this point, if the battery has not been deemed good, the system proceeds to the fail procedure in step 484. If the battery is good, the system proceeds to the charge procedure in step 492 and thereafter returns to the charge control procedure in step 468 to complete the charging process.

Referring back to step 476, if the battery is neither good nor charged, at step 478 the method determines whether enough time has elapsed to warrant another diagnostic run at step 480 or whether the system should return to the charge control procedure at step 490. In the preferred embodiment, diagnostic probes are run every five minutes followed by the charge procedure. Therefore, if five minutes have elapsed since the last probe, the diagnostic procedure is invoked at step 480. Otherwise, the method returns to the charge control procedure at step 490.

Returning to step 444 in FIG. 13A, if the stability timer indicates a check in current stability is required, the system proceeds at step 446 to the current stability check procedure. Overall, the current stability check procedure, as illustrated in FIG. 15, evaluates the charged capacity of the battery on a periodic basis to monitor the average charging current of the battery. In the preferred embodiment, the current stability procedure is invoked every two minutes during charging. Beginning at step 549, the stability timer is restarted. At step 550, if the starting ampere-hours value, AHold, is equal to zero, which indicates a first reading of AH, the system saves the current AH measurement at step 552 and returns to the check procedure at step 566. If AHold is not equal to zero, the previously calculated average charging current is saved as AMPold and a new average charging current is calculated at step 554. In the preferred embodiment, this calculation occurs every three minutes. Next, at step 556, if AMPold is equal to zero, which indicates a second reading is complete, the system similarly returns at step 566 to the check procedure. If AMPold is not equal to zero, the system proceeds at step 558 to calculate the differential current drop, DC. Thereafter, at step 560, the differential current, DC, is compared to the minimum allowed current drop, DELA, to determine if the differential current is falling normally. If the current is falling properly as determined in step 560, the current rising flag remains at its default setting of false. If the current is rising, the current rising flag is set to true at step 564.

After the flag is set, at step 566 the method returns to the check procedure and resumes processing at step 448 in FIG. 13A. At step 448, if the current rising flag is false, indicating a normal current drop such that the current is falling a fraction of an ampere, the method continues with the checking procedure at step 460. A current rising flag set to true, however, indicates a potential for thermal runaway and results in a final check of the battery's disposition in steps 450 through 458 as described above.

According to the invention, after completion of the check procedure, a battery which is good and charged may proceed to the condition procedure. In the preferred embodiment, the operator is given the choice to either disconnect the battery once it is deemed good and charged or leave it attached for conditioning. If the battery is left unattended, however, the battery will automatically be conditioned by default. Overall, the conditioning procedure equalizes the cells and electrodes within the cells of the battery which may have unequal discharge levels or uneven electrolyte concentrations due to stratification. Conditioning is recommended in order to increase performance and life expectancy of the battery.

As illustrated in FIG. 14A, the conditioning procedure begins at step 496 by informing the operator via the display 34 that the battery is good and giving the operator the option to stop the conditioning process. In steps 498 through 510, an evaluation of various previously measured charging parameters determines the level at which to set the maximum charging current, Imax. At a minimum, the maximum charging current will be set to 2 A. Thereafter, in step 512, various conditioning parameters are set at limiting levels and conditioning is begun. For example, the charger current is set to the maximum charging current allowed, the charger voltage is set to the maximum charging voltage allowed, and a voltage comparator, V1, is initialized at zero. In addition, at step 512 a timer, TIMEVCHECK, used to track periodic tests of voltage stability, is initiated at zero. According to the invention, the goal of the conditioning process is to charge until there is a stable voltage, that is, to bring the voltage comparator, V1, equal to the battery voltage, V, within the accuracy of the system.

After the conditioning parameters are set, current voltage and current measurements are taken and the battery capacity, AH, is updated at step 514. At step 516 in FIG. 14B, the average voltage during conditioning, Vave, is set to the previous voltage calculation, V, followed by another voltage and current measurement and AH update at step 518. At step 520, if the current measurement is very low, less than 0.3A, indicating that the cables were removed, the conditioning procedure is stopped and the method proceeds directly to the shutdown procedure at step 522. However, if the current is adequate, a new voltage, V, is then calculated at step 524 based on the average voltage during conditioning, Vave, and the last voltage measurement, V. This averaging process smoothes the measurements to ensure consistent values.

Next, according to the invention, evaluation of the conditioning process occurs at fixed intervals. In the preferred embodiment, the voltage stability is evaluated every ten minutes as determined by the timer, TIMEVCHECK, at step 526. If the timer indicates that ten minutes have elapsed, at step 532 the voltage at the beginning and ending time periods are compared. If the voltage is constant or decreasing over time, that is, V1 is greater than or equal to V, the system proceeds to the good/stop procedure at step 546 since the conditioning process is complete. If the voltage is rising, indicating charging is not complete, the timer is restarted and the comparison voltage, V1, is reset to V at step 536.

Referring back to step 526, if less than ten minutes have elapsed, the method looks for low voltage readings at steps 528 and 538. At step 528, a voltage less than 12.5V is indicative of a shorted battery and thus, the method proceeds to the fail procedure at step 530. At step 538, a voltage less than 13.4V requires that the charger current setting be incremented by 0.1A, with an upper limit of 10A, in order to raise the voltage so that conditioning can effectively proceed.

Finally, at step 544 the battery's capacity, AH, is compared to the maximum charging AH allowed, AHmax. If the capacity is less than the maximum allowed, the system loops back to step 516. Once the capacity exceeds the maximum, the system proceeds at step 546 to the good/stop procedure.

FIGS. 16 through 20 illustrate the steps taken to inform the operator as to the disposition of the battery as determined by the diagnostic tester and charger method. The figures further illustrate the types of messages and prompting implemented during the various shut down and precautionary routines. The good/stop procedure, illustrated in FIG. 16, is implemented at various points in the overall diagnostic testing and charging procedure after the battery is fully charged and tests "good" (see FIG. 13, step 458). The good/stop procedure begins at step 570 by turning off the charge/discharge unit. Next, at step 572 the operator is informed via the display device 34 that testing is complete followed by a computer generated tone at step 574. In the preferred embodiment, the testing complete message is displayed on the first line of the display device.

In steps 576 through 588, the method loops until the battery cables are removed and the operator presses a key. More particularly, at step 576, after a short delay, 1 second, a message informing the operator that the battery tested "good" is displayed followed by another 1 second delay. Then, a message displaying the determined cranking value is displayed, also followed by a 1 second delay. The voltage is then read at step 577 and evaluated at step 578. If the voltage measured is greater than a threshold voltage, indicating that a battery is present, the operator is instructed to remove the cables at step 582. In the preferred embodiment, a voltage greater than 2V is used as the threshold voltage. Alternatively, if the voltage is less than 2V, the operator is instructed to "press any key" at step 586.

In the preferred embodiment, the remove cables message or the press any key message is displayed on the second line of the display device such that the message alternates being displayed every half second with the good battery message displayed in step 576. Therefore, until the cables are removed and a key press is registered at step 588, the method loops back to step 576 and continues to display the results of the previous test. In the preferred embodiment, the operator will disconnect the cables from the battery and press a key to start a new test on a different battery. Thus, once a key is pressed, the method proceeds to the start up procedure at step 590 in FIG. 6 to begin testing again.

The untestable procedure, illustrated in FIG. 17, occurs when the open circuit voltage registers a very low voltage, less than 0.3V, and the operator presses the start key. (See FIG. 6, step 143). The untestable procedure begins at step 594 by confirming that the charge/discharge unit is turned off. Next, at step 596 the operator is informed via the display device 34 that the battery is untestable/bad. At step 598, the operator is instructed to press any key. In the preferred embodiment, the untestable/bad message or the press any key message is displayed until a key press is registered at step 600. Once a key is pressed, the display is erased and the method proceeds to the start up procedure at step 602. (See FIG. 6).

The shutdown procedure, illustrated in FIG. 18, is interrupt driven so that when the operator selects stop via the input device the diagnostic or charging process ceases and is shutdown properly. Similarly, if the conducting cables 18 are disconnected during the diagnostic or charging procedure, an interrupt is generated and the shutdown procedure is invoked immediately to minimize arcing and prevent potential sparking if the cables are reconnected. The shutdown procedure begins at step 618 by shutting off the charge/discharge unit. At step 619, the system determines under what condition the system was shut down. If the operator pressed the stop button, at step 620 a message indicating that diagnostic testing and charging was stopped by the operator is displayed followed by a computer generated tone to alert the operator at step 622. If the shut down was initiated by the removal of the cables, at step 621 a message indicating that that cables were removed is displayed followed by a computer generated tone at step 622. In the preferred embodiment, these messages are displayed on the first line of the display device.

Thereafter, in steps 624 through 640, the operator is informed as to the status of the battery. In the preferred embodiment, an evaluation of two flags determines which message is displayed to the operator. After a short delay of 1 second at step 624, the flag settings are evaluated. If the good and charged flags are true, the operator is informed that the battery is good at step 628 followed by a 1 second delay and a message displaying the determined cranking value, CCA. If the good flag is true, but the charged flag is false, the operator is informed that the battery is good but has a low charge at step 632 followed by a 1 second delay and a message displaying the determined cranking value, CCA. Finally, if none of the conditions are met, at step 638 the operator is informed that the test is incomplete. In the preferred embodiment, the message describing the battery's disposition is displayed on the second line of the display device. Posting of the proper message is followed by a short delay of 1 second at step 640.

Thereafter, at step 641, the voltage is measured and evaluated at step 642. If the voltage measured is greater than a threshold voltage, the operator is instructed to remove the cables at step 646 followed periodically by a computer generated tone at step 648. In the preferred embodiment, a voltage greater than 2V is used as the threshold voltage. If the voltage is less than 2V, the operator is instructed to press any key at step 650.

In the preferred embodiment, the remove cables message or the press any key message is displayed on the second line of the display device such that the message alternates being displayed every half second with the battery's disposition message displayed in step 628 or 632. Therefore, until a key press is registered at step 652, the method loops back to step 624. Once a key is pressed, the display is erased and the method proceeds to the start up procedure at step 654. (See FIG. 6).

The fail procedure, illustrated in FIG. 19, may be implemented at various points in the overall diagnostic testing and charging procedure after the battery is deemed "bad," that is, defective or lacking adequate cranking after one or more charging attempts (see FIG. 9A, step 301). The fail procedure begins at step 658, by turning off the charge/discharge unit. Next, at step 660 the operator is informed via the display device 34 that the battery is "bad" followed by a computer generated tone at step 662. In the preferred embodiment, the bad battery message is displayed on the first line of the display device.

Next, the fail procedure loops through a display process from step 664 to step 676 waiting for the operator to remove the cables and press any key. In step 664, a short delay, 1 second, is followed by a message informing the operator to replace or adjust the battery followed by another 1 second delay. Then, a message displaying the determined cranking value is displayed, also followed by a 1 second delay. In the preferred embodiment, these messages are displayed on the second line of the display device. The voltage is then measured at step 665 and evaluated at step 666. If the voltage measured is greater than a threshold voltage, the operator is instructed to remove the cables at step 670 followed periodically by a computer generated tone at step 672. In the preferred embodiment a voltage greater than 2 is used as the threshold voltage. If the voltage is less than 2V, the operator is instructed to press any key at step 674.

In the preferred embodiment, the remove cables message or the press any key message is displayed on the second line of the display device such that the message alternates, being displayed every half second with the replace/adjust battery message displayed in step 664. Therefore, until a key press is registered at step 676, the method loops back to step 664. Once a key is pressed, the display is erased and the method proceeds to the start up procedure at step 678. (See FIG. 6).

Like the shutdown procedure, the fault shutdown procedure, illustrated in FIG. 20, is interrupt driven. That is, if a fault occurs in the diagnostic unit, the fault generates an interrupt. In particular, faults are generated by overheating or component failure. The fault shutdown procedure is invoked at the beginning of the discharge procedure if the current falls below an acceptable minimum level indicating a faulty current while at the same time the battery voltage is acceptable. The fault shutdown procedure is also invoked at the beginning of the charge procedure if the current falls below an acceptable minimum level while at the same time the battery voltage is unacceptable. When a fault occurs in the unit, the operator should analyze the fault and determine the source of the problem before initiating a retest.

The fault shutdown procedure begins at step 682 by turning off the charge/discharge unit. Next, at step 684 the operator is informed via the display device 34 that a fault shutoff has occurred followed by a computer generated tone at step 685. The fault shutdown procedure then determines if the diagnostic unit requires servicing in step 686 to step 690 because of charge of discharge failure.

If servicing is not required, a short delay 1 second at step 691 is followed by a unit temperature reading at step 692. If the temperature is deemed high at step 693, for safety purposes a voltage comparison at step 694 determines whether the operator is prompted to "remove cables" or simply "wait for reset" of the unit. If, however, the unit temperature is not deemed high the method proceeds to the start up procedure at step 701. (See FIG. 6).

As can be seen from the foregoing, a method and system have been provided for testing and charging a battery wherein the microprocessor based diagnostic test unit utilizes a charger combined with a rapidly variable load to safely and efficiently test, charge and condition batteries of various sizes and types. The disclosed diagnostic unit is capable of adequately stressing the battery to accurately determine if there is sufficient power to sustain a discharge for more than a brief instant. The diagnostic unit is also capable of accurately predicting the chargeability and full-charge performance of the battery in addition to providing safe, rapid and reliable recharge of the battery.

In view of the many possible embodiments to which the principles of this invention may be applied, it should be recognized that the embodiment described herein with respect to the drawing figures is meant to be illustrative only and should not be taken as limiting the scope of invention. For example, those of skill in the art will recognize that the elements of the illustrated embodiment shown in software may be implemented in hardware and vice versa or that the illustrated embodiment can be modified in arrangement and detail without departing from the spirit of the invention. Therefore, the invention as described herein contemplates all such embodiments as may come within the scope of the following claims and equivalents thereof.

I claim:

1. A method of charging a battery, comprising:
   outputting a charge voltage to the battery in dependence on a base voltage level;
   adjusting the charging voltage in steps of predetermined magnitude to provide first, second and third voltage levels;
   measuring first, second, third and fourth currents, wherein the first current is measured at the first voltage level, the fourth current is measured at the third voltage level, and the second and third currents are measured at the second voltage level at differing times;
   calculating a first differential from the difference in the first and second currents and calculating a second differential from the difference in the third and fourth currents;
   comparing the first differential to the second differential; and
   adjusting the base voltage as a function of the comparison.

2. The method as recited in claim 1, wherein the first voltage level is less than the second voltage level and the second voltage level is less than the third voltage level.

3. The method as recited in claim 1, wherein the first voltage level is greater than the second voltage level and second voltage level is greater than the third voltage level.

4. The method as recited in claim 1, wherein the step of adjusting the base voltage further comprises the step of increasing the base voltage a selected increment amount if the first differential is greater than the second differential.

5. The method as recited in claim 1, wherein the step of adjusting the base voltage further comprises the step of decreasing the base voltage a selected increment amount if the first differential is less than the second differential.

6. The method as recited in claim 1, wherein the step of measuring further comprises delaying the measurement of the first current for a predetermined time increment.

7. The method as recited in claim 1, wherein the step of measuring further comprises delaying the measurement of the second current for a first predetermined time increment and the measurement of the third current for a second predetermined time increment greater than the first predetermined time increment.

8. The method as recited in claim 7, wherein the first predetermined time increment is selected to allow the current to become substantially stable.

9. The method as recited in claim 8, wherein the second predetermined time increment is selected to allow the current to become substantially stable.

10. The method as recited in claim 1, wherein the step of measuring further comprises delaying the measurement of the fourth current for a predetermined time increment.

11. The method as recited in claim 1, wherein the first and second voltage levels and the second and third voltage levels generally differ by a predetermined voltage step.

12. The method as recited in claim 11, wherein the predetermined voltage step is selected to generate a minimal measurable current response.

13. The method as recited in claim 1, further comprising the step of accumulating in a moving average the result of the step of comparing each time the step of comparing is performed.

14. The method as recited in claim 13, further comprising the step of making the accumulated moving average relative on a zero to one scale and using the relative, accumulated moving average multiplied by a predetermined voltage when adjusting the charging voltage.

15. The method as recited in claim 11, wherein the first and second voltage levels and the second and third voltage levels generally differ by the predetermined voltage step.

16. The method as recited in claim 1, further comprising the steps of determining if the battery is effectively charged and, if the battery is effectively charged, conditioning the battery.

17. The method as recited in claim 16, wherein the step of conditioning the battery comprises supplying a constant current to the battery to generally equalize the battery cells and substantially destratify the battery electrolyte.

18. The method as recited in claim 17, wherein the step of determining if the battery is effectively charged comprises determining if the charging current falls below a fraction of a determined capacity of the battery in ampere-hours.

19. The method as recited in claim 17, wherein the step of determining if the battery is effectively charged comprises determining if the charging current falls below a predetermined fraction of an estimate of the cranking power of the battery at full charge.

20. The method as recited in claim 1, further comprising the step of monitoring for a drop in current and, if a drop in current is detected, stopping the charging of the battery.

21. The method as recited in claim 1, further comprising the step of performing a diagnostic test on the battery to determine if the battery is in a condition to be effectively charged.

22. A readable medium having processor-executable instructions for use in charging a battery, the instructions performing the steps comprising:
   outputting a charge voltage to the battery in dependence on a base voltage level;
   adjusting the charging voltage in steps of predetermined magnitude to provide first, second and third voltage levels;
   measuring first, second, third and fourth currents, wherein the first current is measured at the first voltage level, the fourth current is measured at the third voltage level, and the second and third currents are measured at the second voltage level at differing times;
   calculating a first differential from the difference in the first and second currents and calculating a second differential from the difference in the third and fourth currents;
   comparing the first differential to the second differential; and
   adjusting the base voltage as a function of the comparison.

23. A method of charging a battery, comprising:
   outputting a charge current to the battery in dependence on a base current level;
   adjusting the charging current in steps of predetermined magnitude to provide first, second and third current levels;
   measuring first, second, third and fourth voltages, wherein the first voltage is measured at the first current level, the fourth voltage is measured at the third current level, and the second and third voltages are measured at the second current level at differing times;

calculating a first differential from the difference in the first and second voltages and calculating a second differential from the difference in the third and fourth voltages;

comparing the first differential to the second differential; and adjusting the base current as a function of the comparison.

24. The method as recited in claim 23, wherein the step of measuring further comprises the step of delaying each of the measurements of the first, second, third and fourth voltages for a respective, predetermined time increment.

25. The method as recited in claim 24, wherein the respective, predetermined time increments for measuring the first, third and fourth voltages are selected to allow the current to become substantially stable.

26. A battery tester and charger system, comprising:

an adjustable power source adapted to electrically charge a battery at variable current or voltage levels;

an adjustable load adapted to electrically discharge the battery at variable current or voltage levels;

feedback sensors adapted to generate signals indicative of conditions within the system;

a controller in communication with the feedback sensors, the power source and the load, the controller adapted, as a function of the signals, to engage and disengage the power source and the load with a battery and to adjust the power source and the load to effectively test and charge the battery.

27. The system as recited in claim 26, wherein the controller is further adapted to stop the test and charge of the battery as a function of the signals.

28. The system as recited in claim 26, wherein the feedback sensors are selected from a group consisting of a charging current sensor, a discharging current sensor, a voltage sensor, a reverse polarity sensor, a temperature sensor, and a proximity sensor.

29. The system as recited in claim 26, wherein the controller issues commands to the power source to output a charge voltage to the battery in dependence on a base voltage level and to adjust the charge voltage in steps of predetermined magnitude to provide first, second and third voltage levels to the battery, wherein the feedback sensors measure first, second, third and fourth currents being supplied to the battery, the first current being measured at the first voltage level, the fourth current being measured at the third voltage level, and the second and third currents being measured at the second voltage level at differing times, and wherein the controller is further adapted to calculate a first differential from the difference in the first and second currents and a second differential from the difference in the third and fourth currents, to compare the first differential to the second differential and to command the power source to adjust the base voltage as a function of the comparison thereby effectively charging the battery.

30. The system as recited in claim 26, further comprising a display and an input device in communication with the controller, the display providing feedback to an operator of the system and the input device receiving input from the operator to control the operation of the system.

31. The system as recited in claim 26, further comprising a printer for outputting information representative of the signals generated by the sensors.

32. The system as recited in claim 30, wherein the controller causes the battery to be automatically tested and charged in response to the operator using the input device to initiate the operation of the system.

33. The system as recited in claim 26, wherein the controller is adapted to perform a diagnostic ramp procedure to provide an instantaneous current versus voltage analysis to determine if the controller should proceed with causing the battery to be charged.

34. The system as recited in claim 26, further comprising a cabinet in which is carried the adjustable power source, the rapidly adjustable load, the feedback sensors and the controller, the cabinet further comprising a safety chamber adapted to carry the battery.

35. The system as recited in claim 34, wherein the safety chamber further comprises a safety glass cover.

36. The system as recited in claim 34, wherein the safety chamber has a proximity sensor for detecting the presence of the battery.

37. The system as recited in claim 34, wherein the safety chamber has a temperature sensor.

38. In a battery diagnostic and charging system connectable to a battery, a method for operating the system, comprising:

performing a diagnostic test on the battery;

if the battery passes the diagnostic test, charging the battery; and during the steps of performing the diagnostic test and charging the battery, sensing if a disconnection of the battery from the system occurs and, in response to a sensed disconnect, automatically discontinuing the steps of performing the diagnostic test and charging the battery.

39. The method as recited in claim 38, further comprising the step of testing the state of the battery while determining if the battery is in a condition to be recharged and recharging the battery.

40. In a battery diagnostic and charging system connectable to a battery, a method for operating the system, comprising:

sensing if a reverse connection exists between the battery and the system;

if the reverse connection is not sensed, performing a diagnostic test on the battery; and if the battery passes the diagnostic test, charging the battery.

* * * * *